US011668010B2

(12) United States Patent
Hu et al.

(10) Patent No.: US 11,668,010 B2
(45) Date of Patent: Jun. 6, 2023

(54) NOBLE METAL COATED SILVER NANOWIRES, METHODS FOR PERFORMING THE COATING

(71) Applicant: C3Nano Inc., Hayward, CA (US)

(72) Inventors: Yongxing Hu, Fremont, CA (US); Xiqiang Yang, Hayward, CA (US); Ying-Syi Li, Fremont, CA (US); Alexander Seung-il Hong, Hayward, CA (US); Melanie Mariko Inouye, Fremont, CA (US); Yadong Cao, San Jose, CA (US); Ajay Virkar, San Mateo, CA (US)

(73) Assignee: C3 Nano, Inc., Hayward, CA (US)

( * ) Notice: Subject to any disclaimer, the term of this patent is extended or adjusted under 35 U.S.C. 154(b) by 972 days.

(21) Appl. No.: 15/354,733

(22) Filed: Nov. 17, 2016

(65) Prior Publication Data

US 2017/0067166 A1 Mar. 9, 2017

Related U.S. Application Data

(62) Division of application No. 14/823,001, filed on Aug. 11, 2015, now Pat. No. 9,530,534.

(Continued)

(51) Int. Cl.
 *C23C 18/44* (2006.01)
 *C23C 18/54* (2006.01)
 (Continued)

(52) U.S. Cl.
 CPC .............. *C23C 18/44* (2013.01); *B32B 9/045* (2013.01); *B32B 15/018* (2013.01); *B32B 15/04* (2013.01);
 (Continued)

(58) Field of Classification Search
 CPC ..... C23C 18/1635; C23C 18/54; C23C 18/42; C23C 18/1637; C23C 18/44;
 (Continued)

(56) References Cited

U.S. PATENT DOCUMENTS

| 4,348,462 A | 9/1982 | Chung |
| 4,623,676 A | 11/1986 | Kistner |

(Continued)

FOREIGN PATENT DOCUMENTS

| CN | 1712464 A | 12/2005 |
| CN | 101901897 A | 12/2010 |

(Continued)

OTHER PUBLICATIONS

Luo, et al "Silver-Coated Copper Nanowires with Improved Anti-Oxidation Property as Conductive Fillers in Low-Density Polyethylene", The Canadian Journal of Chemical Engineering, vol. 91, Apr. 2013, pp. 630-637. (Year: 2013).*

(Continued)

*Primary Examiner* — Katherine A Bareford
(74) *Attorney, Agent, or Firm* — Christensen, Fonder, Dardi; Elizabeth A. Gallo; Peter S. Dardi

(57) ABSTRACT

Metal nanowires with uniform noble metal coatings are described. Two methods, galvanic exchange and direct deposition, are disclosed for the successful formation of the uniform noble metal coatings. Both the galvanic exchange reaction and the direct deposition method benefit from the inclusion of appropriately strong binding ligands to control or mediate the coating process to provide for the formation of a uniform coating. The noble metal coated nanowires are effective for the production of stable transparent conductive films, which may comprise a fused metal nanostructured network.

16 Claims, 16 Drawing Sheets

Related U.S. Application Data

(60) Provisional application No. 62/142,870, filed on Apr. 3, 2015.

(51) Int. Cl.

| | |
|---|---|
| *C09D 133/06* | (2006.01) |
| *C23C 18/16* | (2006.01) |
| *B32B 27/20* | (2006.01) |
| *B32B 9/04* | (2006.01) |
| *B32B 27/28* | (2006.01) |
| *B32B 27/08* | (2006.01) |
| *B32B 15/04* | (2006.01) |
| *B32B 15/08* | (2006.01) |
| *B82Y 30/00* | (2011.01) |
| *C09D 11/52* | (2014.01) |
| *C09D 101/02* | (2006.01) |
| *C09D 139/06* | (2006.01) |
| *C23C 18/42* | (2006.01) |
| *H01B 1/22* | (2006.01) |
| *H01B 13/30* | (2006.01) |
| *H05K 1/02* | (2006.01) |
| *H05K 1/09* | (2006.01) |
| *H05K 3/10* | (2006.01) |
| *H05K 3/12* | (2006.01) |
| *B32B 15/01* | (2006.01) |
| *C09D 105/08* | (2006.01) |
| *B82Y 20/00* | (2011.01) |

(52) U.S. Cl.
CPC .............. *B32B 15/08* (2013.01); *B32B 27/08* (2013.01); *B32B 27/20* (2013.01); *B32B 27/28* (2013.01); *B82Y 30/00* (2013.01); *C09D 11/52* (2013.01); *C09D 101/02* (2013.01); *C09D 133/06* (2013.01); *C09D 139/06* (2013.01); *C23C 18/1635* (2013.01); *C23C 18/1637* (2013.01); *C23C 18/42* (2013.01); *C23C 18/54* (2013.01); *H01B 1/22* (2013.01); *H01B 13/30* (2013.01); *H05K 1/02* (2013.01); *H05K 1/0274* (2013.01); *H05K 1/097* (2013.01); *H05K 3/10* (2013.01); *H05K 3/105* (2013.01); *H05K 3/1283* (2013.01); *B32B 2255/10* (2013.01); *B32B 2255/26* (2013.01); *B32B 2262/103* (2013.01); *B32B 2262/12* (2013.01); *B32B 2307/202* (2013.01); *B32B 2307/412* (2013.01); *B32B 2307/414* (2013.01); *B32B 2457/20* (2013.01); *B82Y 20/00* (2013.01); *C09D 105/08* (2013.01); *H05K 2201/0108* (2013.01); *H05K 2201/026* (2013.01); *Y10T 428/12444* (2015.01); *Y10T 428/12479* (2015.01); *Y10T 428/12486* (2015.01); *Y10T 428/12889* (2015.01); *Y10T 428/12896* (2015.01)

(58) Field of Classification Search
CPC ........ H05K 3/1283; H05K 3/105; H05K 3/10; H05K 1/02; H05K 1/0274; H05K 2201/026; H05K 2201/0108; H05K 1/097; H01B 13/30; H01B 1/22; C09D 139/06; C09D 101/02; C09D 11/52; C09D 105/08; C09D 133/06; B82Y 30/00; B82Y 20/00; B32B 15/08; B32B 15/04; B32B 15/018; B32B 9/045; B32B 27/08; B32B 27/20; B32B 27/28; B32B 2457/20; B32B 2262/103; B32B 2262/12; B32B 2307/202; B32B 2307/412; B32B 2307/414; B32B 2255/10; B32B 2255/26; Y10T 428/12444; Y10T 428/12896; Y10T 428/12889; Y10T 428/12486; Y10T 428/12479

See application file for complete search history.

(56) References Cited

U.S. PATENT DOCUMENTS

| | | | |
|---|---|---|---|
| 5,141,675 | A | 8/1992 | Vandrepool et al. |
| 5,803,957 | A * | 9/1998 | Murakami .............. C23C 18/44 |
| | | | 106/1.13 |
| 8,031,180 | B2 | 10/2011 | Miyamoto et al. |
| 8,349,467 | B2 | 1/2013 | Naoi |
| 8,482,541 | B2 | 7/2013 | Hashimoto et al. |
| 9,183,968 | B1 | 11/2015 | Li et al. |
| 2002/0036143 | A1* | 3/2002 | Segawa ............... C23C 18/1664 |
| | | | 205/187 |
| 2005/0037071 | A1 | 2/2005 | Cao et al. |
| 2005/0082552 | A1 | 4/2005 | Fang et al. |
| 2008/0143906 | A1 | 6/2008 | Allemand et al. |
| 2008/0174775 | A1 | 7/2008 | Moskovits et al. |
| 2010/0197068 | A1 | 8/2010 | Poon et al. |
| 2012/0073947 | A1 | 3/2012 | Sakata et al. |
| 2012/0119352 | A1* | 5/2012 | Iwai ....................... H05K 3/187 |
| | | | 257/734 |
| 2012/0255762 | A1 | 10/2012 | Katagiri et al. |
| 2013/0341074 | A1 | 12/2013 | Virkar et al. |
| 2013/0342221 | A1 | 12/2013 | Virkar et al. |
| 2014/0170407 | A1 | 6/2014 | Zou et al. |
| 2014/0205845 | A1 | 7/2014 | Philip, Jr. et al. |
| 2014/0234661 | A1 | 8/2014 | Allemand et al. |
| 2014/0238833 | A1 | 8/2014 | Virkar et al. |
| 2015/0144380 | A1 | 5/2015 | Yang et al. |
| 2015/0250078 | A1 | 9/2015 | Matsuda et al. |
| 2015/0262729 | A1* | 9/2015 | Aoki ......................... H01B 1/22 |
| | | | 428/570 |
| 2016/0118156 | A1 | 4/2016 | Kawaguchi et al. |
| 2016/0369104 | A1 | 12/2016 | Gu et al. |

FOREIGN PATENT DOCUMENTS

| | | | |
|---|---|---|---|
| CN | 103384933 | A | 5/2014 |
| CN | 103827984 | A | 5/2014 |
| CN | 104025305 | A | 9/2014 |
| EP | 0481667 | A2 | 4/1992 |
| JP | H1-198403 | A | 8/1989 |
| JP | 2008-013798 | A | 1/2008 |
| JP | 2009-120867 | A | 6/2009 |
| JP | 2009-127092 | * | 6/2009 |
| JP | 2011-149092 | A | 8/2011 |
| JP | 2013-155440 | A | 8/2013 |
| TW | 2011-15594 | A | 5/2011 |
| TW | 2014-30167 | A | 8/2014 |
| TW | 2014-34640 | A | 9/2014 |
| TW | 2014-46904 | A | 12/2014 |
| TW | 2015-11605 | A | 3/2015 |
| WO | 2011-016217 | A1 | 2/2011 |
| WO | 2012064768 | A | 5/2012 |
| WO | 2013-187675 | A1 | 12/2013 |
| WO | 2014-069624 | A1 | 5/2014 |
| WO | 2014/084021 | * | 6/2014 |

OTHER PUBLICATIONS

Chinese office action from corresponding Chinese Application No. 201680027045.5 dated Jan. 9, 2019.

Sangermano et al., "UV-Cured Interpenetrating Acrylic-Epoxy Polymer Networks: Preparation and Characterization," Macromolecular Materials and Engineering, (2008), 293(6):515-520. Abstract only.

Elechiguerra et al., "Corrosion at the Nanoscale: The Case of Silver Nanowires and Nanoparticles," Chem. Mater. (Oct. 2005), 17, 6042-6052.

Kim et al., "Highly Transparent Au-Coated Ag Nanowire Transparent Electrode with Reduction in Haze," ACS Appl. Mater. Interfaces, 6, 13527-13534 (Jul. 2014).

(56) References Cited

OTHER PUBLICATIONS

"Slawinski et al., ""Synthesis and Alignment of Silver Nanorods and Nanowires and theFormation of Pt, Pd, and Core/Shell Structures by Galvanic Exchange Directly on Surfaces,"" Langmuir, 23, 10357-10365. (Aug. 2007)."
Sun et al., "Ag Nanowires Coated with Ag/Pd Alloy Sheaths and Their Use as Substrates for Reversible Absorption and Desorption of Hydrogen," Journal of the American Chemical Society, 126, 5940-5941 (Apr. 2004).
Hu et al., "Scalable coating properties of flexible, silver nanowire electrodes," ACS Nano, 4(5):2955-2963 (Apr. 2010).
Slawinski et al., "Twin Plane Decoration of Silver Nanorods with Palladium by Galvanic Exchange at a Controlled Rate," Langmuir, 27, 13293-13301 (Sep. 2011).
Yin et al., "Silver Nanowires Can Be Directly Coated with Amorphous Silica To Generate Well-Controlled Coaxial Nanocables of Silver/Silica," Nano Letters, vol. 2 No. 4, 427-430 (Feb. 2002).
International Search Report and Written Opinion from the corresponding PCT International Application No. PCT/US2016/24627 dated Jun. 24, 2016 (10 pages).
Office action from corresponding Japanese Application No. 2017-551648 dated Oct. 29, 2019.
Office action from corresponding Chinese Application No. 201680027045.5 dated Oct. 20, 2019.
Office action from corresponding Taiwan Application No. 105110634 dated Nov. 27, 2019.
Office action from corresponding Chinese Application No. 201680027045.5 dated Jun. 24, 2020.
Office Action from corresponding Japanese Patent Application No. 2020-138079 dated Jun. 1, 2021.

\* cited by examiner

NOBLE METAL COATED SILVER NANOWIRES, METHODS FOR PERFORMING THE COATING

CROSS REFERENCE TO RELATED APPLICATIONS

This application is a divisional of copending U.S. application Ser. No. 14/823,001 filed Aug. 11, 2015, which is now U.S. Pat. No. 9,530,534, which claims priority to U.S. provisional patent application 62/142,870 filed on Apr. 3, 2015 to Hu et al., entitled "Noble Metal Coated Silver Nanowires, Methods for Performing the Coating and Stabilized Transparent Conductive Films," incorporated herein by reference.

FIELD OF THE INVENTION

The invention relates to silver nanowires with noble metal coatings, method of forming the coated silver nanowires and transparent conductive layers formed from the noble metal coated nanowires.

BACKGROUND OF THE INVENTION

Functional films can play important roles in a range of contexts. For example, electrically conductive films can be important for the dissipation of static electricity when static can be undesirable or dangerous. Optical films can be used to provide various functions, such as polarization, anti-reflection, phase shifting, brightness enhancement or other functions. High quality displays can comprise one or more optical coatings.

Transparent conductors can be used for several optoelectronic applications, for example, touch-screens, liquid crystal displays (LCD), flat panel display, organic light emitting diode (OLED), solar cells and smart windows. Historically, indium tin oxide (ITO) has been the material of choice due to its relatively high transparency at high conductivities. There are however several shortcomings with ITO. For example, ITO is a brittle ceramic which needs to be deposited using sputtering, a fabrication process that involves high temperatures and vacuum and therefore can be relatively slow. Additionally, ITO is known to crack easily on flexible substrates.

SUMMARY OF THE INVENTION

In a first aspect, the invention pertains to a transparent conductive film comprising a sparse metal conductive layer and a substrate supporting the sparse metal conductive layer. In some embodiments, the sparse metal conductive layer can comprise a polymeric polyol and metal nanowire segments comprising silver nanowire core segments and a noble metal coating, and the sparse conductive layer can have an initial sheet resistance of no more than about 150 ohm/sq. Also, the transparent conductive film can have an optical transparency of at least about 85%.

In further aspects, the invention pertains to a method for forming noble metal coated silver nanowires by direct metal deposition, in which the method comprises gradually adding a coating solution comprising dissolved noble metal ions and a metal ion complexing ligand into a reaction solution comprising silver nanowires and a reducing agent to form the noble metal coating on the silver nanowires. The reaction solution can further comprise a capping polymer, such as PVP (polyvinylpyrrolidone).

In another aspect, the invention pertains to a method for forming noble metal coated silver nanowires by galvanic exchange, in which the method comprises gradually adding a coating solution comprising a mixture of noble metal ions and complexing ligands to a heated reaction solution comprising a dispersed blend of silver nanowires and a polymer capping agent to gradually replace silver with noble metal to form an intact silver core with a noble metal coating.

In additional aspects, the invention pertains to a method for forming a transparent conductive film, in which the method comprises drying a layer of metal nanowires, metal ions, a reducing agent, and solvent to remove solvent and drive the fusing of adjacent metal nanowires, wherein the metal nanowires are silver nanowires with a noble metal coating.

In some aspects, the invention pertains to a collection of noble metal coated silver nanowires having a diameter along the length of the nanowire with a standard deviation of no more than about 10 percent of the average diameter.

DETAILED DESCRIPTION OF THE INVENTION

Figure 1:
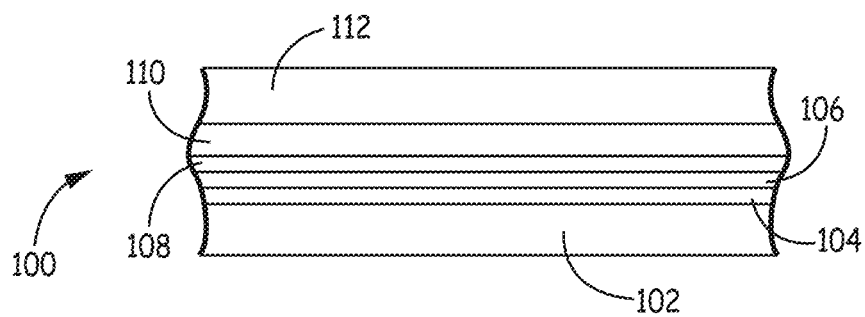
FIG. 1 is a fragmentary side view of a film with a sparse metal conductive layer and various additional transparent layers on either side of the sparse metal conductive layer.

Noble metal coated silver nanowires have been found to be very effective as substitutes for silver nanowires for the formation of transparent conductive films, especially with the formation of fused metal nanostructured networks. Under accelerated wear testing conditions, noble metal coated silver nanowires within transparent conductive layers exhibit significantly improved stability, when subjected to light, heat, chemical agents in the local environment and/or humidity, relative to corresponding structures with silver nanowires. Synthesis techniques are described in which either controlled galvanic replacement or direct deposition can be used to effectively deposit a uniform noble metal coating onto silver nanowires. In particular, direct deposition can be effectively used with room temperature processing, which can provide desirable processing advantages. Suitable metal binding ligands can be provided to stabilize the coating process to provide improved nanowire coatings.

The noble metal coated nanowires can provide significant advantages for the formation of durable transparent conductive films. In particular, the noble metal coatings can significantly stabilize the films with respect to degradation over time in use while also improving or at least not degrading the optical properties of the films. The noble metal coatings can be consistent with the formation of fused metal conductive networks through the deposition of metal ions from solution as metal at the junctions of metal nanowires, which has been found to provide very desirable performance in transparent conductive films.

Silver nanowires have found commercial application in the formation of conductive elements, including transparent conductive films. Transparent electrically conductive elements, e.g., films, of particular interest herein comprise a sparse metal conductive layer. The conductive layers are generally sparse to provide desired amount of optical transparency, so the coverage of the metal has very significant gaps over the layer of the conductive element. For example, transparent electrically conductive films can comprise metal nanowires deposited along a layer where sufficient contact can be provided for electron percolation to provide suitable conduction pathways. In other embodiments, the transparent electrically conductive film can comprise a fused metal nanostructured network, which has been found to exhibit desirable electrical and optical properties. Conductivity referenced herein refers to electrical conductivity unless specifically indicated otherwise. As described herein, the metal coated nanowires can be effectively incorporated into the transparent conductive elements.

Sparse metal conductive layers, regardless of the specific structures, are vulnerable to environmental assaults. The sparse feature implies that the structures are somewhat fragile. Assuming that the elements are appropriately protected from mechanical damage, the sparse metal conductive layers can be vulnerable to damage from various other sources, such as atmospheric oxygen, water vapor, oxidative stress, other corrosive chemicals in the local environment, such as sulfiding agents, light, heat, combinations thereof, and the like. For commercial applications, degradation of properties of the transparent conductive structures should be within desired specifications, which in other words indicates that the transparent conductive layers provide suitable lifetimes for devices incorporating them. Accelerated wear studies are described below to test the transparent conductive films.

The coating of silver nanowires with selected metals has been proposed for several functions. As used herein, noble metals refers to metals having a standard reduction potential greater than silver, so these would include, gold, platinum, iridium, rhodium, palladium and osmium, with a particular interest in gold and platinum. The noble metal coated nanowires are found to be suitable for forming sparse metal conductive layers with desirable electrical conductivity with good optical properties and significant stability with respect to accelerated wear testing. Using the synthesis techniques described herein, uniform coatings can be formed over intact silver nanowire cores. The results in the Examples demonstrate the deposition of smooth gold coatings and smooth platinum coatings onto silver nanowires. Using direct deposition of the coating, the amount of the coating deposited can be increased to relatively large values before the crystal structure of the coated metal begins to distort the surface structure. With galvanic exchange, it is difficult to deposit larger amounts of smooth coating onto the nanowires without damaging the underlying silver nanowire core due to the insulation of the underlying silver from oxidation effects as the coating is developed. With direct deposition, it is possible to deposit at least about 5 weight percent coating metal.

In particular, it has been found that gold coated nanowires and platinum coated nanowires can provide desired stability of sparse metal conductive layers including both fused metal nanostructured networks formed from the noble metal coated nanowires, and also unfused silver nanowire conductive layers. The Examples below demonstrate this improved stability of the transparent conductive films. Desirable methods for forming the metal coated nanowires can involve an improved version of galvanic replacement or the direct deposition of the coating metal.

In controlled galvanic replacement, gold, platinum or other noble metal ions, which generally are provided as metal ion complexes in solution, oxidize silver in the wires while being reduced to the elemental noble metal at elevated temperatures. So the reduced noble metal in elemental form replaces silver as the solid metal in the nanowires. The nanowire coating processes herein have been improved such that more uniform coatings can be deposited. The results in the Examples demonstrate the deposition of smooth gold coatings and smooth platinum coatings onto silver nanowires. In particular, strong binding ligands are introduced into the noble metal ion solution to control the reduction process. Appropriate strong binding ligands shift the free energy of the galvanic exchange such that no galvanic exchange takes place at room temperature, i.e., 20-23° C. The smooth coatings onto very uniform nanowires can result in coated nanowires with a standard deviation of diameter of no more than about 8 percent of the average diameter over the length of the nanowires.

In the direct deposition, a reaction solution is formed with a dispersion of the silver nanowires, and a coating solution with the noble metal ions is gradually added to the reaction solution. The reaction solution is kept under reducing conditions. Hydrazine is a convenient reducing agent because the byproducts are nitrogen and water, although other reducing agents can be used as summarized below. The presence of hydrazine to maintain reducing conditions in the solution with the nanowires is believed to inhibit the oxidation of silver so that the coating process involves only the deposition of the noble metal from the solution. The direct coating method provides flexibility to control the amount of coating material deposited and for the deposition of a relatively thick coating without destabilizing the nanowire structure.

To obtain a uniform coating, the coating processes can be appropriately controlled. Control of the reaction, in addition to the possible use of strong coordinating ligands and/or a polymer capping agent, can involve the gradual addition of the metal ion complexes of the coating metal as a metal ion source solution into the reaction solution. The reactions can be conveniently performed in aqueous solution with optionally some alcohol or other cosolvents. The coordinating ligand can be included in the solution with the metal ions. The metal ions can be provided in suitable complexes, such as the $PtCl_6^{-2}$ complexes, and similar complexes can be used for other metals, such as $AuCl_4^-$. New metal complexes can be formed when stronger binding ligands are added to the coating solution, e.g., $NO_2^-$, which will complex with $Pt^{4+}$ by replacing $Cl^-$. In context, the strength of a ligand may not be completely predictable since it involves features of both the metal ion and the ligand. Complexes with halide ligands can generally be considered to be weak complexes. As noted above, strong ligands can be identified in the context of galvanic exchange by the lack of measurable room temperature reaction of the coating solution. The free energy of the bonding strength of the ligand to the metal influences the effective reduction reaction of the metal and correspondingly the reduction potential.

The ligand binding strength influences the energetics of the reaction, and the effect can be significant if the ligand binding strength is relatively strong. If the ligand binding to the noble metal ion is stronger than to the silver ion, a stronger binding ligand generally slows the noble metal deposition. In this way, the presence of a strong binding ligand can moderate the coating reactions, although the selection of the other reactants and processing conditions are also very significant.

With either nanowire coating approach, the amount of metal deposited in the coatings generally depends on the amount of added noble metal ions and the reaction conditions. As shown in the Examples, at least over a reasonable range of coating amounts, the stability of a transparent electrically conductive film increases with greater amounts of noble metal coatings. Metal coating of the nanowires can affect the sheet resistances of conductive films formed from the nanowires. Since silver metal has the highest electrical conductivity, coating with a noble metal may increase the sheet resistances, which may be balanced by the improved stability of the structure. Applicant has observed approximately equivalent sheet resistances in films formed with the noble metal coated silver nanowires with a slightly increased metal loading. The fusing process used by Applicant provides for a metal connection between the nanowires at points of contact or near approach.

Also, the noble metals generally absorb and scatter less visible light than silver so that in principle, a slightly higher loading of metal can be used for a particular optical transmittance and haze, and a higher loading of metal in a sparse metal conductive layer may decrease the electrical resistance. Thus, in particular for embodiments involving fused metal nanostructured networks, the use of noble metal coated silver nanowires as a material for forming the networks can result in desirable electrical conductivity and optical properties along with significantly improved stability. Moreover, at the same metal loading (mass metal per unit area), the coated wires show less haze and a more neutral color.

Transparent electrically conductive elements, e.g., films, of particular interest herein comprise a sparse metal conductive layer. The conductive layers are generally sparse to provide desired amount of optical transparency, so the coverage of the metal has very significant gaps over the layer of the conductive element. For example, transparent electrically conductive films can comprise metal nanowires deposited along a layer where sufficient contact can be provided for electron percolation to provide suitable conduction pathways. In other embodiments, the transparent electrically conductive film can comprise a fused metal nanostructured network, which has been found to exhibit desirable electrical and optical properties. It has been found that the noble metal coatings do not alter the ability to form desired fused metal nanostructured networks.

In particular, a significant advance with respect to achieving electrically conductive films based on metal nanowires has been the discovery of well controllable processes to form a fused metal network where adjacent sections of the metal nanowires fuse. In particular, it was discovered that halide ions can drive the fusing of metal nanowires to form fused metal nanostructures. Fusing agents comprising halide anions were introduced in various ways to successfully achieve the fusing with a corresponding significant drop in the electrical resistance. Specifically, the fusing of metal nanowires with halide anions has been accomplished with vapors and/or solutions of acid halides as well as with solutions of halide salts. Fusing of metal nanowires with halide sources is described further in published U.S. patent applications 2013/0341074 to Virkar et al., entitled "Metal Nanowire Networks and Transparent Conductive Material," and 2013/0342221 to Virkar et al. (the '221 application), entitled "Metal Nanostructured Networks and Transparent Conductive Material," both of which are incorporated herein by reference.

An extension of the process for forming fused metal nanowire networks was based on reduction/oxidation (redox) reactions that can be provided to result in fused nanowires without destroying the optical properties of the resulting film. Metal for deposition at the junctions can be effectively added as a dissolved metal salt or can be dissolved from the metal nanowires themselves. The effective use of redox chemistry for fusing metal nanowires into a nanostructured network is described further in published U.S. patent application 2014/0238833A1 to Virkar et al. (the '833 application), entitled "Fused Metal Nanostructured Networks, Fusing Solutions with Reducing Agents and Methods for Forming Metal Networks," incorporated herein by reference. The '833 application also described a single solution approach for the formation of fused metal nanostructured networks. Single solution approaches for the formation of fused metal nanostructured layers are described further in copending U.S. patent application Ser. No. 14/448, 504, now U.S. Pat. No. 9,183,968 to Li et al, entitled "Metal Nanowire Inks for the Formation of Transparent Conductive Films with Fused Networks," incorporated herein by reference, and single solution or ink processing to form fused metal nanostructured networks is used in the Examples below.

The desirable inks to achieve effective single deposition inks that cure into fused nanostructured metal networks comprise a desired amount of metal nanowires to achieve appropriate loading of metal in the resulting film. In appropriate solutions, the inks are stable prior to deposition of the ink and drying. The inks can comprise a reasonable amount of polymer binder that contributes to the formation of a stable conducting film for further processing. To obtain good fusing results with one ink systems, hydrophilic polymers have been found to be effective, such as cellulose or chitosan based polymers. Metal ions, as a source of metal for the fusing process, can be supplied as a soluble metal salt.

A single ink formulation provides for depositing a desired loading of metal as a film on the substrate surface and simultaneously providing constituents in the ink that induce the fusing process as the ink is dried under appropriate conditions. These inks can be referred to conveniently as fusing metal nanowire inks with the understanding that the fusing generally does not take place until drying. The inks generally comprise an aqueous solvent, which can further comprise an alcohol and/or other organic solvent in some embodiments. The inks can further comprise dissolved metal salts as a metal source for the fusing process. Without wanting to be limited by theory, it is believed that components of the ink, e.g., alcohol, or other organic compositions, reduce the metal ions from solution to drive the fusing process. Previous experience with the fusing process in these systems suggests that the metal preferentially deposits at the junctions between adjacent metal nanowires. A polymer binder can be provided to stabilize the film and to influence ink properties. The particular formulation of the ink can be adjusted to select ink properties suitable for a particular deposition approach and with specific coating properties on a substrate surface. As described further below, drying conditions can be selected to effectively perform the fusing process.

If the noble metal coated nanowires are substituted for silver nanowires in the processing solutions for the formation of fused metal nanostructured networks, it has been found that the fusing process seems to proceed as expected. Silver ions can be used to provide the material for fusing the nanowires, although other metal ions can be supplied for the fusing metal if desired. In additional or alternative embodiments, other metal ions can be used for fusing, such as silver ions, copper ions, palladium ions, gold ions, tin ions, iron ions, cobalt ions, zinc ions, aluminum ions, platinum ions, nickel ions, cobalt ions, titanium ions, or combinations thereof. The results in the examples are consistent with the noble metal nanowires effectively fusing to form the conductive networks. Presumably, silver is deposited at the junction points of the fused network based on the addition of silver ions in the solution.

For applications as transparent conductive films, it is desirable for the fused metal nanowire networks to maintain good optical transparency and low haze. In principle, optical transparency is inversely related to the loading with higher loadings leading to a reduction in transparency, and haze generally increases with loading, although processing of the network can also significantly affect the optical properties. Also, polymer binders and other additives can be selected to maintain good optical transparency.

The transparent conductive films generally comprise several components or layers that contribute to the processability and/or the mechanical properties of the structure without detrimentally altering the optical properties. For example, a polymer overcoat can be applied directly over the sparse metal conductive layer to stabilize the conductive layer. The sparse metal conductive layers can be designed to have desirable optical properties when incorporated into the transparent conductive films. The sparse metal conductive layer may or may not further comprise a polymer binder. A polymer undercoat layer or a polymer overcoat layer can comprise a stabilization composition to further stabilize the sparse metal conductive layer. Unless otherwise indicated, references to thicknesses refer to average thicknesses over the referenced layer or film, and adjacent layers may intertwine at their boundaries depending on the particular materials. In some embodiments, the total film structure can have a total transmission of visible light of at least about 85%, a haze of no more than about 2 percent and a sheet resistance of no more than about 250 ohm/sq.

The transparent conductive layers generally can have their performance evaluated as formed, and performance can degrade with age of the film. In particular, electrical conductivity can degrade due to degradation of the metal network. However, it has been found that the use of noble metal coated silver nanowires can achieve significant stabilization with respect to light and environmental assaults relative to equivalent conductive layers formed with silver nanowires formed without the metal coating. Stability of the conductive layer can be evaluated with accelerated wear test, and several versions are described below. Testing is performed with or without a polymer overcoat. In general, good stability is obtained for samples even without a polymer overcoat under fairly stringent test conditions. These results indicate that the noble metal coated silver nanowires can provide highly desirable stability for the formation of transparent conductive films for a range of products.

Noble Metal Coated Silver Nanowires and Methods for Forming the Coated Nanowires The coated silver nanowires have a noble metal coating that can appear smooth under microscopic visualization of the coating with appropriate synthesis approaches for the coating. The processing can be adjusted to alter the amount of noble metal deposited. Based on improved coating methods, direct noble metal deposition or galvanic replacement can be used to deposit a smooth noble metal coating. In general, noble metal coating can be controlled with selected ligands that moderate the noble metal deposition to form the coating as well as through the appropriate selection of other reactants and processing conditions, such as appropriate gradual addition of reactants. The controlling of the noble metal reduction has been found to facilitate the formation of a desirably smooth and uniform coating. As described herein, the noble metal coated silver nanowires provide excellent materials for formation of transparent conductive films.

Commercial silver nanowires are available from Sigma-Aldrich (Missouri, USA), Cangzhou Nano-Channel Material Co., Ltd. (China), Blue Nano (North Carolina, USA), EMFUTUR (Spain), Seashell Technologies (California, USA), Aiden/C3Nano (Korea/USA), Nanocomposix (USA), Nanopyxis (Korea), K&B (Korea), ACS Materials (China), KeChuang Advanced Materials (China), and Nanotrons (USA). Alternatively, silver nanowires can also be synthesized using a variety of known synthesis routes or variations thereof. In general, any of these silver nanowires can be used for coating with the noble metals as describe herein.

Silver in particular provides excellent electrical conductivity so it is desirable for the core of the coated metal nanowires to be silver. To have good transparency and low haze, it is desirable for the nanowires to have a small range of diameters. In particular, it is desirable for the metal nanowires to have an average diameter of no more than about 250 nm, in further embodiments no more than about 150 nm, and in other embodiments from about 10 nm to about 120 nm. With respect to average length, nanowires with a longer length are expected to provide better electrical conductivity within a network. In general, the metal nanowires can have an average length of at least a micron, in further embodiments, at least 2.5 microns and in other embodiments from about 5 microns to about 100 microns, although improved synthesis techniques developed in the future may make longer nanowires possible. An aspect ratio can be specified as the ratio of the average length divided by the average diameter, and in some embodiments, the nanowires can have an aspect ratio of at least about 25, in further embodiments from about 50 to about 5000 and in additional embodiments from about 100 to about 2000. A person of ordinary skill in the art will recognize that additional ranges of nanowire dimensions within the explicit ranges above are contemplated and are within the present disclosure. The application of the noble metal coating does not qualitatively change the ranges of nanowire dimensions indicated above.

As noted above, the noble metals include gold, platinum, iridium, rhodium, palladium and osmium, with a particular interest in gold and platinum. In general, the results suggest that the stability of conductive structures increases with increased amount of noble metal deposition, although stability may gradually plateau as more coating metal is provided. Also, there are tradeoff with respect to coating with larger amounts of noble metals with respect to electrical conductivity, processing time and cost, stability and other parameters. Using the direct deposition approach, a greater amount of noble metal can be deposited with a smooth coating and a stable silver metal core than can be obtained with galvanic exchange. In general, relative to the amount of silver, the noble metal coating can be no more than about 55 wt %, in further embodiments from about 0.03 wt % to about 40 wt %, and in additional embodiments from about 0.9 wt % to about 25 wt %. The amount of coated metal generally ranges from about 0.02 atomic percent (at %) to about 35 at %, in further embodiments from about 0.1 at % to about 25 at %, in additional embodiments from about 0.5 at % to about 20 at % as a fraction of the total coated nanowire. Assuming that the coating is uniform and has a bulk material density, the coating thickness can be roughly estimated from the weight amount of the coating and the average parameters of the initial nanowires. Coating thicknesses can be estimated base on the weight of the coating material and the density of the coating metal. The smoothness of the coating can be determined using high resolution transmission electron micrographs (TEM). Using the smooth coating techniques developed herein, the coated nanowires can have a standard deviation $$\left(\sigma = \sqrt{\frac{1}{N}\sum_{i=1}^{N}(d_i - \bar{d})^2}\right)$$

in diameter of the wires along their lengths of no more than about 10%, in further embodiments no more than about 8% and in additional embodiments no more than about 6% relative to the average diameter. Expressed in a different way, the root mean square roughness of the coated nanowires can be no more than about 1 nm, in further embodiments no more than about 0.8 nm and in additional embodiments no more than about 0.6 nm. A person or ordinary skill in the art will recognize that additional ranges of coating amounts within the explicit ranges above are contemplated and are within the present disclosure.

Two suitable techniques for the formation of uniform noble metal coatings have been developed with desirable results. A first technique is based on galvanic exchange, and a second technique is based on direct deposition. In galvanic exchange, the reducing agent for depositing the noble metal is the silver metal of the nanowires. The galvanic exchange reaction is driven with heat that provides activation energy to allow silver oxidation to reduce the noble metal. The galvanic replacement reaction can take place effectively in an aqueous solution. In the second technique, the noble metal is deposited directly from a reducing solution without oxidation of the silver nanowire. The noble metal ions can be added to a reactant solution comprising the silver nanowires and reducing agent. With both coating techniques, it can be desirable to have a polymer capping agent present.

In the galvanic replacement approach, the reaction generally involves reacting complexed noble metal ions with silver nanowires in an aqueous solution in the presence of a capping polymer. A metal ion source solution comprising complexed noble metal ions can be added gradually to the reaction solution to moderate the reaction. The reaction solution generally can comprise initially dispersed silver nanowires, and a capping polymer in an aqueous solution. The reaction solution does not comprise a reducing agent. The reaction solution generally comprises silver nanowires in concentrations from about 0.0001 wt % to about 5 wt %, in further embodiments from about 0.02 wt % to about 3.5 wt % and in additional embodiments from about 0.03 wt % to about 2.5 wt %. The reaction solution can also comprise from about 0.005 wt % to about 2 wt % capping polymer, in further embodiments from about 0.01 wt % to about 1.5 wt % and in additional embodiments from about 0.02 wt % to about 1 wt % capping polymer. Polymer capping agents for silver nanowires are traditionally polyvinyl pyrrolidone (PVP), although in principle other polymers can be used, such as polyvinyl alcohol, polyacrylic acid, polyvinyl acetate, poly(vinyl pyrrolidone)-b-poly(vinyl alcohol), combinations thereof or the like. The solvent can be water, alcohol or blends of solvents with water (aqueous solvents) or alcohol. For example, the silver nanowires can be provided in an alcohol dispersion that is then mixed with water to form the reaction solution. A person of ordinary skill in the art will recognize that additional ranges of composition ranges within the explicit ranges above are contemplated and are within the present disclosure.

In the galvanic replacement approach, the metal ion source solution can comprise metal ion complexes along with a suitably strong complexing ligand in an aqueous solution. In the Examples below, the complexing ligand was ethylene diamine. Generally, suitable ligands include, for example, nitrite, diethyl amine, ethylene diamine, nitrilotriacetic acid, iminobis(methylene phosphonic acid), aminotris (methylene phosphonic acid), ethylene diamine tetraacetic acid (EDTA), 1,3-propylenediaminetetraacetic acid (1,3-PDTA), triethylene tetramine, tri(2-aminoethyl) amine, diethylenetriaminepentaacetic acid, 1,2-cyclohexanediaminotetraacetic acid, iminodiacetic acid, methyliminodiacetic acid, N-(2-acetamide) iminoacetic acid, N-(2-carboxyethyl) iminodiacetic acid, N-(2-carboxymethyl)imino dipropionic acid, picolinic acid, dipicolinic acid, histidine, combinations thereof. Desirable strong binding ligands can be identified by the inhibition of galvanic exchange at room temperature with no measureable reaction taking place in 1 hour at room temperature under the range of reactant concentrations provided herein. In other words, in some embodiments, the ligands that complex with the noble metal ions can lower their reduction potential to be smaller at room temperature than Ag oxidation potential, which can effectively eliminate the galvanic replacement at room temperature. In some embodiments, the molar ratio of ligands to metal ions can be at least about 0.05, in further embodiments at least about 0.1, in additional embodiments at least about 0.5, in further embodiments at least about 0.75, in some embodiments at least about 0.80, and in other embodiments from about 0.85 to about 10. The metal ion source solution can comprise a noble metal ion concentration from about $1\times10^{-8}$ M to about 10 M, in further embodiments from about 0.0001 M to about 5 M, and in additional embodiments from about 0.001 M to about 2.5 M. The noble metal ions can be added as a suitable salt, such as nitrate, sulfate, perchlorate, hexafluorophosphate, hexafluoroantimonate, and halides. The solvent can be water or other reasonable aqueous solution. A person of ordinary skill in the art will recognize that additional ranges of metal ion ligand ratio within the explicit ranges above are contemplated and are within the present disclosure.

To drive the thermal reaction for galvanic exchange with the noble metal complex ions oxidizing the silver from the nanowires while the noble metal complex ions are reduced and deposited as a coating on the nanowires, the silver nanowire solution generally is heated to boiling and maintained at boiling throughout the reaction, although the reaction can be driven by heating to a somewhat lower temperature, e.g., generally at least about 40° C., in further embodiments at least about 60° C. and in additional embodiments at least about 75° C. For solvent blends, the boiling point can change over the course of the reaction as lower boiling components boil off, so the temperature of the reaction solution can change over the course of the reaction if the heating element is set at a temperature over the boiling temperature of the lower boiling components when there is a solvent blend. A person or ordinary skill in the art will recognize that additional temperature ranges within the explicit ranges above are contemplated and are within the present disclosure. The use of noble metal ion complexes with the addition of a strong binding complexing ligand in the source solution has provided for the formation of very uniform coatings onto the silver nanowires. Similar to the coordinating ligand of the direct coating approach, the complexing ligand can be added effectively in significant molar excess relative to the noble metal ions, although a ligand to metal ion ratio less than 1, generally at least about 0.05, can be beneficial with respect to the coating. The noble metal complex ion source solution can be gradually added to the heated reaction solution to initiate the reaction. For example, the noble metal complex ion source solution can be added to the reaction solution over at least an hour, in further embodiments at least two hours and in additional embodiments at least 3 hours, which can be at a relatively constant rate over the time period. A person of ordinary skill in the art will recognize that additional ranges of addition time are contemplated and are within the present disclosure. The reaction solution is generally mixed continuously during the reaction in a suitable container with a suitable mixing apparatus based on the reaction scale.

After the galvanic exchange coating reaction is completed the coated nanowires can be collected through the addition of acetone to the reaction solution. The modified solvent with the acetone results in the settling of the nanowires. The settled nanowires can be collected through filtering and/or centrifugation or the like, and the filtrate can be washed with water or other suitable solvent. In some embodiments, the washed coated nanowires can be re-suspended in water, alcohol or solvent blend, and the washing process can be repeated with an acetone settling, filtering/centrifugation and washing steps. In some embodiments, the washing is performed a total of three times, although additional washing steps can be performed as desired. The washed nanowires can then be resuspended in water, alcohol or solvent blend with water and/or alcohol.

As demonstrated in the Examples, uniform coatings of varying amounts of coated metal can be formed also through direct deposition. With respect to the direct coating deposition, the coating reaction mixture comprises a reducing agent that creates a reducing environment that drives the coating formation. Suitable reducing agents can include, for example, hydrazine, NaBH$_4$, LiAlH$_4$, ascorbic acid, oxalic acid, formic acid and the like. The coating process generally can be performed without the application of heat. Applicant has obtained desirable coating results using a coating solution comprising in addition to the reducing agent, a polymer capping agent and in some embodiments a coordinating ligand for the noble metal ion. Polymer capping agents for silver nanowires are traditionally polyvinyl pyrrolidone (PVP), although in principle other polymers can be used, such as polyvinyl alcohol, polyacrylic acid, polyvinyl acetate, poly(vinyl pyrrolidone)-b-poly(vinyl alcohol), combinations thereof or the like. With respect to the metal coordinating ligand, the selection of an appropriate ligand has been found to be useful with respect to obtaining a smooth coating.

The direct coating deposition process can be controlled for the formation of smooth coating, for example, through the use of a coordination ligand, the gradual addition of the noble metal ions and control of other reaction parameters. The ligand complex with the noble metal can lower its reduction potential and reduce or eliminate the galvanic reaction in the presence of reducing agent. Generally, the coordinating ligand can be added in significant molar excess relative to the noble metal ions, although a ligand to metal ion ratio less than about 1, generally at least about 0.05, can be beneficial with respect to the coating. A person of ordinary skill in the art will recognize that additional molar ratios of ligands to metal ions between about 0.05 and about 1 are contemplated and are within the present disclosure. In the examples, the experiments have used sodium nitrite effectively, but other coordinating ligands other than nitrite, such as ethylene diamine, nitrilotriacetic acid, iminobis (methylene phosphonic acid), histidine, combinations thereof, and the like, can in principle be used effectively. While in principle, the ligands for stabilizing direct deposition may be a somewhat different group than the ligands that stabilize galvanic exchange, from a present practical perspective the desirable ligands for galvanic exchange are also the desirable ligands for direct deposition. Thus, suitable ligands to control the direct deposition process include, for example, nitrite, ethylene diamine, diethyl amine, nitrilotriacetic acid, iminobis(methylene phosphonic acid), triethylene tetramine, tri(2-amnoethyl) amine, histidine, aminotris (methylene phosphonic acid), ethylene diamine tetraacetic acid (EDTA), 1,3-propylenediaminetetraacetic acid (1,3-PDTA), triethylene tetramine, tri(2-aminoethyl) amine, diethylenetriaminepentaacetic acid, 1,2-cyclohexanediaminotetraacetic acid, iminodiacetic acid, methyliminodiacetic acid, N-(2-acetamide) iminoacetic acid, N-(2-carboxyethyl) iminodiacetic acid, N-(2-carboxymethyl)imino dipropionic acid, picolinic acid, dipicolinic acid, combinations thereof.

In some embodiments for direct deposition, a reaction solution is formed with the silver nanowires, the polymer capping agent, and the reducing agent in a solvent, and a coating solution is added gradually that comprises noble metal ions, additional capping polymer, and ligands in a solvent. This procedure has been found to be effective for the formation of smooth coatings. The reaction solution generally comprises silver nanowires in concentrations from about 0.0001 wt % to about 5 wt %, in further embodiments from about 0.02 wt % to about 3.5 wt % and in additional embodiments from about 0.03 wt % to about 2.5 wt %. The reacting solution can comprise from about 0.005 wt % to about 2 wt % capping polymer, in further embodiments from about 0.01 wt % to about 1.5 wt % and in additional embodiments from about 0.02 wt % to about 1 wt % capping polymer. The reaction solution generally also comprises from about 1 micromolar (μM) reducing agent to about 1 millimolar (mM), in further embodiments from about 2 μM to about 500 μM and in additional embodiments from about 3 μM to about 250 μM reducing agent. The solution is generally water, alcohols, such as ethanol, isopropanol, glycols and the like, or blends of water (aqueous), alcohol and other solvents, and suitable cosolvents can be selected that do not destabilize the nanowire dispersions. A coating solution that can function as the metal complex ion source can be gradually added to the reaction solution to effectuate the coating process. A person of ordinary skill in the art will recognize that additional ranges of concentrations in the reaction solution within the explicit ranges above are contemplated and are within the present disclosure.

The total amount of coating metal supplied as ions in the coating solution can be selected to provide the desired noble metal coating thickness. The coating solution can comprise noble ions in amounts generally ranging from about 0.02 atomic percent (at %) to about 35 at %, in further embodiments from about 0.1 at % to about 30 at %, in additional embodiments from about 0.5 at % to about 25 at % as a fraction of the total coated nanowire. The noble metal ions can be supplied as a suitable salt, which may comprise weakly bound ligands. Suitable noble metal salts include, for example, nitrate, sulfate, perchlorate, hexafluorophosphate, hexafluoroantimonate, and halides. The coating solution can comprise 0.00005 M to about 0.05 M, in further embodiments from about 0.0001 M to about 0.025 M and in additional embodiments from about 0.0002 M to about 0.01 M noble metal ions. The coordinating ligand is generally included in significant molar excess. In some embodiments, the molar ratio of ligands to metal ions can be at least about 0.05, in further embodiments at least about 0.1, in additional embodiments at least about 0.5, in further embodiments at least about 0.75, in some embodiments at least about 0.8, and in other embodiments from about 0.85 to about 10. The coating solution can also comprise capping polymer from about 0.001 wt % to about 5 wt % capping polymer, in further embodiments from about 0.002 wt % to about 1.5 wt % and in additional embodiments from about 0.005 wt % to about 1 wt % capping polymer. The coating solution generally is also aqueous, such as water solvent. A person of ordinary skill in the art will recognize that additional ranges of concentrations in the coating solution within the explicit ranges above are contemplated and are within the present disclosure.

The rate of addition of addition of the coating solution can be adjusted to obtain uniform coating properties. The coating solution can be added at room temperature. Generally, the coating solution depending on scale can be added over a period from about 5 minutes to about 5 hours, in further embodiments from about 7 minutes to about 4.5 hours, and in additional embodiments from about 10 minutes to about 4 hours. A person of ordinary skill in the art will recognize that additional ranges of time within the explicit ranges of process times above are conceived and are within the present disclosure. The coating solution can be added at an approximately constant rate over the addition period. The reaction solution is generally mixed continuously during the reaction in a suitable container with a suitable mixing apparatus based on the reaction scale. Direct coating can have scale up advantages and avoidance of limits on amount of coating deposition suitable by galvanic replacement.

After the direct coating reaction is completed the coated nanowires can be collected through the addition of acetone to the reaction solution. The modified solvent with the acetone results in the settling of the nanowires. The settled nanowires can be collected through filtering and/or centrifugation or the like, and the filtrate can be washed with water or other suitable solvent. In some embodiments, the washed coated nanowires can be re-suspended in water, alcohol or solvent blend, and the washing process can be repeated with an acetone settling, filtering/centrifugation, and washing steps. In some embodiments, the washing is performed a total of three times, although additional washing steps can be performed as desired. The washed nanowires can then be re-suspended in water, alcohol or solvent blend with water and/or alcohol.

Transparent Conductive Films

The transparent electrically conductive structures or films generally comprise a sparse metal conductive layer that provides the electrical conductivity without significantly adversely altering the optical properties and various additional layers that provide mechanical support as well as protection of the conductive element. The sparse metal conductive layer is extremely thin and correspondingly susceptible to damage by mechanical and other abuses. The sparse metal conductive layer can be formed on a substrate that can have one or more layers in the structure of the substrate. The substrate generally can be identified as a self-supporting film or sheet structure. A thin solution processed layer, referred to as an undercoat, can be optionally placed along the top surface of the substrate film and immediately under the sparse metal conductive layer. Also, the sparse metal conductive can be coated with additional layers that provide some protection on the side of the sparse metal conductive layer opposite the substrate. In general, the electrically conductive structure can be placed in either orientation in the final product, i.e., with the substrate facing outward to the substrate against the surface of the product supporting the electrically conductive structure.

Referring to FIG. 1, representative transparent conductive film 100 comprises a substrate 102, undercoat layer 104, sparse metal conductive layer 106, overcoat layer 108, optically clear adhesive layer 110 and protective surface layer 112, although not all embodiments include all layers. A transparent conductive film generally comprises a sparse metal conductive layer and at least one layer on each side of the sparse metal conductive layer. The total thickness of the transparent conductive film can generally have a thickness from 10 microns to about 3 millimeters (mm), in further embodiments from about 15 microns to about 2.5 mm and in other embodiments from about 25 microns to about 1.5 mm. A person of ordinary skill in the art will recognize that additional ranges of thicknesses within the explicit ranges above are contemplated and are within the present disclosure. In some embodiments, the length and width of the film as produced can be selected to be appropriate for a specific application so that the film can be directly introduced for further processing into a product. In additional or alternative embodiments, a width of the film can be selected for a specific application, while the length of the film can be long with the expectation that the film can be cut to a desired length for use. For example, the film can be in long sheets or a roll. Similarly, in some embodiments, the film can be on a roll or in another large standard format and elements of the film can be cut according to a desired length and width for use.

Substrate 102 generally comprises a durable support layer formed from an appropriate polymer or polymers. In some embodiments, the substrate can has a thickness from about 20 microns to about 1.5 mm, in further embodiments from about 35 microns to about 1.25 mm and in additional embodiments from about 50 microns to about 1 mm. A person of ordinary skill in the art will recognize that additional ranges of thicknesses of the substrate within the explicit ranges above are contemplated and are within the present disclosure. Suitable optically clear polymers with very good transparency, low haze and good protective abilities can be used for the substrate. Suitable polymers include, for example, polyethylene terephthalate (PET), polyethylene naphthalate (PEN), polyacrylate, poly(methyl methacrylate), polyolefin, polyvinyl chloride, fluoropolymers, polyamide, polyimide, polysulfone, polysiloxane, polyetheretherketone, polynorbornene, polyester, polystyrene, polyurethane, polyvinyl alcohol, polyvinyl acetate, acrylonitrile-butadiene-styrene copolymer, cyclic olefin polymer, cyclic olefin copolymer, polycarbonate, copolymers thereof or blend thereof or the like. Suitable commercial polycarbonate substrates include, for example, MAKROFOL SR243 1-1 CG, commercially available from Bayer Material Science; TAP® Plastic, commercially available from TAP Plastics; and LEXAN™ 8010 CDE, commercially available from SABIC Innovative Plastics. Protective surface layer 112 can independently have a thickness and composition covering the same thickness ranges and composition ranges as the substrate as described in this paragraph above.

Optional undercoat 104 and/or optional overcoat 108, independently selectable for inclusion, can be placed respectively under or over sparse metal conductive layer 106. Optional coatings 104, 108 can comprise a curable polymer, e.g., heat curable or radiation curable polymers. Suitable polymers for coatings 104, 108 are described below as binders for inclusion in the metal nanowire inks, and the list of polymers, corresponding cross linking agents and additives apply equally to optional coatings 104, 108 without repeating the discussion explicitly here. Some of the binder polymers are referred to as hardcoat polymers due to abrasion resistance, and hardcoat polymers can be desirable in particular for overcoat 108 to provide abrasion resistance. Suitable hardcoat polymers are also described in copending U.S. patent application Ser. No. 14/741,119 to Gu et al., entitled "Transparent Polymer Hardcoats and Corresponding Transparent Films," incorporated herein by reference. Coatings 104, 108 can have a thickness from about 25 nm to about 2 microns, in further embodiments from about 40 nm to about 1.5 microns and in additional embodiments from about 50 nm to about 1 micron. A person of ordinary skill in the art will recognize that additional ranges of overcoat thickness within the explicit ranges above are contemplated and are within the present disclosure.

Optional optically clear adhesive layer 110 can have a thickness from about 10 microns to about 300 microns, in further embodiments from about 15 microns to about 250 microns and in other embodiments from about 20 microns to about 200 microns. A person of ordinary skill in the art will recognize that additional ranges of thicknesses of optically clear adhesive layers within the explicit ranges above are contemplated and are within the present disclosure. Suitable optically clear adhesives can be contact adhesives. Optically clear adhesives include, for example, coatable compositions and adhesive tapes. UV curable liquid optically clear adhesives are available based on acrylic or polysiloxane chemistries. Suitable adhesive tapes are available commercially, for example, from Lintec Corporation (MO series); Saint Gobain Performance Plastics (DF713 series); Nitto Americas (Nitto Denko) (LUCIACS CS9621T and LUCIAS CS9622T); DIC Corporation (DAITAC LT series OCA, DAITAC WS series OCA and DAITAC ZB series); PANAC Plastic Film Company (PANACLEAN series); Minnesota Mining and Manufacturing (3M, Minnesota, USA—product numbers 8146, 8171, 8172, 8173 and similar products) and Adhesive Research (for example product 8932).

The amount of nanowires delivered onto the substrate for sparse metal conductive layer 106 can involve a balance of factors to achieve desired amounts of transparency and electrical conductivity. While thickness of the nanowire network can in principle be evaluated using scanning electron microscopy, the network can be relatively sparse to provide for optical transparency, which can complicate the measurement. In general, the sparse metal conductive structure, e.g., fused metal nanowire network, would have an average thickness of no more than about 5 microns, in further embodiments no more than about 2 microns and in other embodiments from about 10 nm to about 500 nm. However, the sparse metal conductive structures are generally relatively open structures with significant surface texture on a submicron scale. The loading levels of the nanowires can provide a useful parameter of the network that can be readily evaluated, and the loading value provides an alternative parameter related to thickness. Thus, as used herein, loading levels of nanowires onto the substrate is generally presented as milligrams of nanowires for a square meter of substrate. In general, the nanowire networks can have a loading from about 0.1 milligrams (mg)/m$^2$ to about 300 mg/m$^2$, in further embodiments from about 0.5 mg/m$^2$ to about 200 mg/m$^2$, and in other embodiments from about 1 mg/m$^2$ to about 150 mg/m$^2$. A person of ordinary skill in the art will recognize that additional ranges of thickness and loading within the explicit ranges above are contemplated and are within the present disclosure. If the sparse metal conductive layer is patterned, the thickness and loading discussion applies only to the regions where metal is not excluded or significantly diminished by the patterning process.

Generally, within the total thicknesses above for particular components of film 100, layers 102, 104, 106, 108, 110, 112 can be subdivided into sub-layers, for example, with different compositions from other sub-layers. For example, multiple layer optically clear adhesives are discussed above. Thus, more complex layer stacks can be formed. Sub-layers may or may not be processed similarly to other sub-layers within a particular layer, for example, one sub-layer can be laminated while another sub-layer can be coated and cured.

Stabilization compositions can be placed in appropriate layers to stabilize the sparse metal conductive layers. For embodiments in which the sparse metal conductive layers comprise fused nanostructured metal networks, the sparse metal conductive layer itself as formed may not comprise a stabilization compound since the presence of such compounds can inhibit the chemical fusing process. In alternative embodiments, it may be acceptable to include the stabilization agents in coating solutions for forming the sparse metal conductive layer. Similarly, stabilization compounds can be included in an optically clear adhesive composition. However, it has been found that the stabilization compounds can be included effectively in a coating layer, which can correspondingly be made relatively thin while still providing effective stabilization.

With respect to sensitivities to environmental damage, it has been found that an undercoat and/or overcoat can comprise a stabilization composition that can provide desirable protection, and certain classes of optically clear adhesives and/or barrier layers can also provide valuable protection from light, heat, chemicals and other environmental damage. While the focus herein is on environmental assaults from humid air, heat and light, polymer sheets used to protect the conductive layers from these environmental assaults can also provide protection from contact and the like.

Various stabilization compounds have been proposed for silver nanowire conductive layers. For example, corrosion inhibitors such as phenolic compounds (bis(4-hydroxyphenol)sulphone, 2,6-di-tert-butylphenol or resorcinol) are proposed as stabilization compounds in published U.S. patent application 2014/0205845 to Philip, Jr. et al., entitled "Stabilization Agents for Transparent Conductive Films," incorporated herein by reference. Mercaptotetrazoles, mercaptotriazoles and their tautomers are described as stabilization compounds in published U.S. patent application 2014/0170407 to Zou et al., entitled "Anticorrosion Agents for Transparent Conductive Film," incorporated herein by references. Terpenes, plant-derived rosins, hinder phenols, tetrazoles, triazoles, phosphines, thioethers, photodesensitizing metal salts, and antioxidants are described as stabilization agents in published U.S. patent application 2014/0234661 to Allemand et al., entitled "Methods to Incorporate Silver Nanowire-Based Transparent Conductors in Electronic Devices," incorporated herein by reference. The compounds references above and other suitable stabilization agents can be incorporated into the films to further stabilize the sparse metal conductive layer.

A coating layer can comprise a stabilization compound in a concentration from about 0.1 weight percent (wt %) to about 8 wt %, in further embodiments from about 0.25 wt % to about 6 wt % and in additional embodiments from about 0.5 wt % to about 4 wt %. As shown in the Examples below, it has been found that increases in stabilization compound concentrations do not necessarily result in improved stabilization. In addition, it has been found that thin coating layers can effectively provide stabilization, which implies that the layers do not function as a reservoir of stabilization compounds since a great volume of stabilization compound does not seem correlated with stabilization. Thus, it has been found that desirable stabilization can be obtained with low totals of stabilization agents, which can be desirable form a processing perspective as well as having a low effect on the optical properties.

For some applications, it is desirable to pattern the electrically conductive portions of the film to introduce desired functionality, such as distinct regions of a touch sensor. Patterning can be performed by changing the metal loading on the substrate surface either by printing metal nanowires at selected locations with other locations being effectively barren of metal or to etch or otherwise ablate metal from selected locations either before and/or after fusing the nanowires. In some embodiments, it has been discovered that high contrast in electrical conductivity can be achieved between fused and unfused portions of a layer with essentially equivalent metal loading so that patterning can be performed by selectively fusing the metal nanowires. This ability to pattern based on fusing provides significant additional patterning options based on selective fusing of the nanowires, for example, through the selective delivery of a fusing solution or vapor. Patterning based on selective fusing of metal nanowires is described in the '833 application application above.

Figure 2:
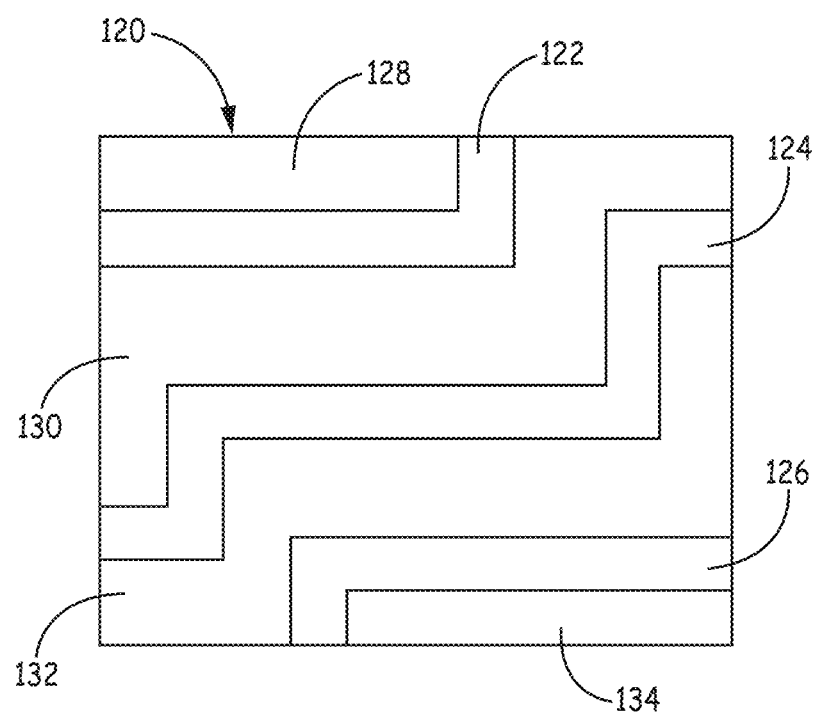
FIG. 2 is a top view of a representative schematic patterned structure with three electrically conductive pathways formed with sparse metal conductive layers.

As a schematic example, a fused metal nanostructured network can form conductive patterns along a substrate surface 120 with a plurality of electrically conductive pathways 122, 124, and 126 surrounded by electrically resistive regions 128, 130, 132, 134, as shown in FIG. 2. As shown in FIG. 2, the fused area correspond with three distinct electrically conductive regions corresponding with electrically conductive pathways 122, 124, and 126. Although three independently connected conductive regions have been illustrated in FIG. 2, it is understood that patterns with two, four or more than 4 conductive independent conductive pathways or regions can be formed as desired. For many commercial applications, fairly intricate patterns can be formed with a large number of elements. In particular, with available patterning technology adapted for the patterning of the films described herein, very fine patterns can be formed with highly resolved features. Similarly, the shapes of the particular conductive regions can be selected as desired.

The transparent conductive film is generally built up around the sparse metal conductive element which is deposited to form the functional feature of the film. Various layers are coated, laminated or otherwise added to the structure using appropriate film processing approaches. As described herein, the nature of the layers can significant can alter the long term performance of the transparent conductive film. The deposit of the sparse metal conductive layer is described further below in the context of a fused metal nanostructured layers, but un-fused metal nanowire coatings can be similarly deposited except that the fusing components are absent.

The sparse metal conductive layer generally is solution coated onto a substrate, which may or may not have a coating layer on top of the substrate that then forms an undercoat adjacent the sparse metal conductive layer. An overcoat can be solution coated onto the sparse metal conductive layer in some embodiments. Crosslinking, with application of UV light, heat or other radiation, can be performed to crosslink polymer binders in the coating layers and/or the sparse metal conductive layer, which can be performed in one step or multiple steps. A stabilization compound can be incorporated into the coating solution for forming a coating layer. The coating precursor solution can comprise 0.001 weight percent (wt %) to about 0.1 wt % stabilization compound, in further embodiments from about 0.002 wt % to about 0.05 wt %, in additional embodiments from about 0.003 wt % to about 0.04 wt % and in other embodiments from about 0.003 wt % to about 0.025 wt % stabilization compound. A person of ordinary skill in the art will recognize that additional ranges of stabilization compound in a coating solution within the explicit ranges above are contemplated and are within the present disclosure.

An optically clear adhesive layer can be laminated or otherwise applied to the sparse metal conductive layer with or without an overcoat layer(s) that becomes located adjacent the optically clear adhesive. A stabilization composition can be associated with an optically clear adhesive through the contact of a solution comprising the stabilization compound with the optically clear adhesive, such as by spraying or dipping a solution of the stabilization compound with the optically clear adhesive. Alternatively or additionally, the stabilization compound can be incorporated into the adhesive composition during the manufacture of the adhesive. In some embodiments, an additional protective film can be applied over the optically clear adhesive layer, or a protective polymer film can be laminated or otherwise applied to an overcoat or directly to the sparse metal conductive layer without an intervening optically conductive adhesive.

A protective film can be placed over the optically clear adhesive to form a further protective layer. Suitable protective films can be formed of similar materials as described for the substrate material, or specific commercial barrier films can be used. For example, the protective films can be formed from polyester sheets with coatings. Hard coated polyester sheets are commercially available, in which the hard coats are crosslinked acrylic polymers or other crosslinked polymers. Hard coated polyester sheets are desirable due to a relatively low cost and desirable optical properties, such as a high transparency and low haze. Thicker hard coated polyester films can be used to increase their barrier function, such as sheets having a thickness from about 15 microns to about 200 microns and in further embodiments from about 20 microns to about 150 microns. A person of ordinary skill in the art will recognize that additional ranges of hard coated polyester films are contemplated and are within the present disclosure.

While the mechanisms of temporal degradation of the electrically conductive ability of the sparse metal conductive layers is not completely understood, it is believed that molecular oxygen ($O_2$) and/or water vapor may play a role. From this perspective, barrier films to oxygen and/or water vapor would be desirable, and physical barrier tend to block migration of environmental contaminants generally. Noble metals generally are more resistant to environmental degradation, which is believed to contribute to the observed stabilization of the electrically conductive film in accelerated wear testing.

The results presented herein indicate that a combination of stabilization features can effectively provide a high degree of stabilization as determined with selected accelerated age testing. Specifically, the inclusion of noble metal coated silver nanowires to form the sparse metal conductive layer can be combined with an optically clear adhesive with a polyester carrier film and/or a protective cover film to stabilize the sparse metal conductive layer and maintain a desirably low sheet resistance.

Optically clear adhesive layers and thicker protective films covering the sparse metal conductive layer can be formed with holes or the like in appropriate locations to provide for electrical connections to the conductive layer. In general, various polymer film processing techniques and equipment can be used to the processing of these polymer sheets, and such equipment and techniques are well developed in the art, and future developed processing techniques and equipment can be correspondingly adapted for the materials herein.

Sparse Metal Conductive Layers

Sparse metal conductive layers are generally formed from metal nanowires. With sufficient loading and selected nanowire properties, reasonable electrical conductivity can be achieved with the nanowires with corresponding appropriate optical properties. It is expected that the stabilized film structures described herein can yield desirable performance for films with various sparse metal conductive structures. However, particularly desirable properties have been achieved with fused metal nanostructured networks.

As summarized above, several practical approaches have been developed to accomplish the metal nanowire fusing. The metal loading can be balanced to achieve desirable levels of electrical conductivity with good optical properties. In general, the metal nanowire processing can be accomplished through deposition of two inks with the first ink comprising the metal nanowires and the second ink comprising a fusing composition, or through the deposition of an ink that combines the fusing elements into the metal nanowire dispersion. The inks may or may not further comprise additional processing aids, binders or the like. Suitable patterning approaches can be selected to be suitable for the particular ink system.

In general, one or more solutions or inks for the formation of the metal nanostructured network can collectively comprise well dispersed metal nanowires, a fusing agent, and optional additional components, for example, a polymer binder, a crosslinking agent, a wetting agent, e.g., a surfactant, a thickener, a dispersant, other optional additives or combinations thereof. The solvent for the metal nanowire ink and/or the fusing solution if distinct from the nanowire ink can comprise an aqueous solvent, an organic solvent or mixtures thereof. In particular, suitable solvents include, for example, water, alcohols, ketones, esters, ethers, such as glycol ethers, aromatic compounds, alkanes, and the like and mixtures thereof. Specific solvents include, for example, water, ethanol, isopropyl alcohol, isobutyl alcohol, tertiary butyl alcohol, methyl ethyl ketone, glycol ethers, methyl isobutyl ketone, toluene, hexane, ethyl acetate, butyl acetate, ethyl lactate, PGMEA (2-methoxy-1-methylethylacetate), or mixtures thereof. While the solvent should be selected based on the ability to form a good dispersion of metal nanowires, the solvents should also be compatible with the other selected additives so that the additives are soluble in the solvent. For embodiments in which the fusing agent is included in a single solution with the metal nanowires, the solvent or a component thereof may or may not be a significant component of the fusing solution, such as alcohols and can be selected accordingly if desired.

In general, the nanowires can be formed from a range of metals, such as silver, gold, indium, tin, iron, cobalt, platinum, palladium, nickel, cobalt, titanium, copper and alloys thereof, which can be desirable due to high electrical conductivity. To form the stabilized sparse metal conductive layers described herein, the noble metal nanowires described in detail above can be introduced into the sparse metal conductive layers. The metal nanowire ink, in either a one ink or two ink configuration, can include from about 0.01 to about 1 weight percent metal nanowires, in further embodiments from about 0.02 to about 0.75 weight percent metal nanowires and in additional embodiments from about 0.04 to about 0.5 weight percent metal nanowires. A person of ordinary skill in the art will recognize that additional ranges of metal nanowire concentrations within the explicit ranges above are contemplated and are within the present disclosure. The concentration of metal nanowires influences the loading of metal on the substrate surface as well as the physical properties of the ink.

Polymer binders and the solvents are generally selected consistently such that the polymer binder is soluble or dispersible in the solvent. In appropriate embodiments, the metal nanowire ink generally comprises from about 0.02 to about 5 weight percent binder, in further embodiments from about 0.05 to about 4 weight percent binder and in additional embodiments from about 0.1 to about 2.5 weight percent polymer binder. In some embodiments, the polymer binder comprises a crosslinkable organic polymer, such as a radiation crosslinkable organic polymer and/or a heat curable organic binder. To facilitate the crosslinking of the binder, the metal nanowire ink can comprise in some embodiments from about 0.0005 wt % to about 1 wt % of a crosslinking agent, in further embodiments from about 0.002 wt % to about 0.5 wt % and in additional embodiments from about 0.005 to about 0.25 wt %. The nanowire ink can optionally comprise a rheology modifying agent or combinations thereof. In some embodiments, the ink can comprise a wetting agent or surfactant to lower the surface tension, and a wetting agent can be useful to improve coating properties. The wetting agent generally is soluble in the solvent. In some embodiments, the nanowire ink can comprise from about 0.01 weight percent to about 1 weight percent wetting agent, in further embodiments from about 0.02 to about 0.75 weight percent and in other embodiments from about 0.03 to about 0.6 weight percent wetting agent. A thickener can be used optionally as a rheology modifying agent to stabilize the dispersion and reduce or eliminate settling. In some embodiments, the nanowire ink can comprise optionally from about 0.05 to about 5 weight percent thickener, in further embodiments from about 0.075 to about 4 weight percent and in other embodiments from about 0.1 to about 3 weight percent thickener. A person of ordinary skill in the art will recognize that additional ranges of binder, wetting agent and thickening agent concentrations within the explicit ranges above are contemplated and are within the present disclosure.

A range of polymer binders can be suitable for dissolving/dispersing in a solvent for the metal nanowires, and suitable binders include polymers that have been developed for coating applications. Hard coat polymers, e.g., radiation curable coatings, are commercially available, for example as hard coat materials for a range of applications that can be selected for dissolving in aqueous or non-aqueous solvents.

Suitable classes of radiation curable polymers and/or heat curable polymers include, for example, polyurethanes, acrylic resins, acrylic copolymers, cellulose ethers and esters, other water insoluble structural polysaccharides, polyethers, polyesters, epoxy containing polymers, and mixtures thereof. Examples of commercial polymer binders include, for example, NEOCRYL® brand acrylic resin (DMS NeoResins), JONCRYL® brand acrylic copolymers (BASF Resins), ELVACITE® brand acrylic resin (Lucite International), SANCURE® brand urethanes (Lubrizol Advanced Materials), cellulose acetate butyrate polymers (CAB brands from Eastman™ Chemical), BAYHYDROL™ brand polyurethane dispersions (Bayer Material Science), UCECOAT® brand polyurethane dispersions (Cytec Industries, Inc.), MOWITOL® brand polyvinyl butyral (Kuraray America, Inc.), cellulose ethers, e.g., ethyl cellulose or hydroxypropyl methyl cellulose, other polysaccharide based polymers such as Chitosan and pectin, synthetic polymers like polyvinyl acetate, and the like. The polymer binders can be self-crosslinking upon exposure to radiation, and/or they can be crosslinked with a photoinitiator or other crosslinking agent. In some embodiments, photocrosslinkers may form radicals upon exposure to radiation, and the radicals then induce crosslinking reactions based on radical polymerization mechanisms. Suitable photoinitiators include, for example, commercially available products, such as IRGACURE® brand (BASF), GENOCURE™ brand (Rahn USA Corp.), and DOUBLECURE® brand (Double Bond Chemical Ind., Co, Ltd.), combinations thereof or the like.

Wetting agents can be used to improve the coatability of the metal nanowire inks as well as the quality of the metal nanowire dispersion. In particular, the wetting agents can lower the surface energy of the ink so that the ink spreads well onto a surface following coating. Wetting agents can be surfactants and/or dispersants. Surfactants are a class of materials that function to lower surface energy, and surfactants can improve solubility of materials. Surfactants generally have a hydrophilic portion of the molecule and a hydrophobic portion of the molecule that contributes to its properties. A wide range of surfactants, such as nonionic surfactants, cationic surfactant, anionic surfactants, zwitterionic surfactants, are commercially available. In some embodiments, if properties associated with surfactants are not an issue, non-surfactant wetting agents, e.g., dispersants, are also known in the art and can be effective to improve the wetting ability of the inks. Suitable commercial wetting agents include, for example, COATOSIL™ brand epoxy functionalized silane oligomers (Momentum Performance Materials), SILWET™ brand organosilicone surfactant (Momentum Performance Materials), THETAWET™ brand short chain non-ionic fluoro surfactants (ICT Industries, Inc.), ZETASPERSE® brand polymeric dispersants (Air Products Inc.), SOLSPERSE® brand polymeric dispersants (Lubrizol), XOANONS WE-D545 surfactant (Anhui Xoanons Chemical Co., Ltd), EFKA™ PU 4009 polymeric dispersant (BASF), MASURF FP-815 CP, MASURF FS-910 (Mason Chemicals), NOVEC™ FC-4430 fluorinated surfactant (3M), mixtures thereof, and the like.

Thickeners can be used to improve the stability of the dispersion by reducing or eliminating settling of the solids from the metal nanowire inks. Thickeners may or may not significantly change the viscosity or other fluid properties of the ink. Suitable thickeners are commercially available and include, for example, CRAYVALLAC™ brand of modified urea such as LA-100 (Cray Valley Acrylics, USA), polyacrylamide, THIXOL™ 53L brand acrylic thickener, COAPUR™ 2025, COAPUR™ 830 W, COAPUR™ 6050, COAPUR™ XS71 (Coatex, Inc.), BYK® brand of modified urea (BYK Additives), Acrysol DR 73, Acrysol RM-995, Acrysol RM-8W (Dow Coating Materials), Aquaflow NHS-300, Aquaflow XLS-530 hydrophobically modified polyether thickeners (Ashland Inc.), Borchi Gel L 75 N, Borchi Gel PW25 (OMG Borchers), and the like.

Additional additives can be added to the metal nanowire ink, generally each in an amount of no more than about 5 weight percent, in further embodiments no more than about 2 weight percent and in further embodiments no more than about 1 weight percent. Other additives can include, for example, anti-oxidants, UV stabilizers, defoamers or anti-foaming agents, anti-settling agents, viscosity modifying agents, or the like.

As noted above, fusing of the metal nanowires can be accomplished through various agents. Without wanting to be limited by theory, the fusing agents are believed to mobilize metal ions, and the free energy seems to be lowered in the fusing process. Excessive metal migration or growth may lead in some embodiments to a degeneration of the optical properties, so desirable results can be achieved through a shift in equilibrium in a reasonably controlled way, generally for a short period of time, to generate sufficient fusing to obtain desired electrical conductivity while maintaining desired optical properties. In some embodiments, initiation of the fusing process can be controlled through a partial drying of the solutions to increase concentrations of the components, and quenching of the fusing process can be accomplished, for example, through rinsing or more completing drying of the metal layer. The fusing agent can be incorporated into a single ink along with the metal nanowires. The one ink solution can provide appropriate control of the fusing process.

In embodiments of particular interest, a process is used in which a sparse nanowire film is initially deposited and subsequent processing with or without depositing another ink provides for the fusing of the metal nanowires into a metal nanostructured network, which is electrically conducting. The fusing process can be performed with controlled exposure to a fusing vapor and/or through the deposition of a fusing agent in solution. Sparse metal conductive layers are generally formed on a selected substrate surface. The as deposited nanowire film is dried to remove the solvent. Processing can be adapted for patterning of the film as described further below.

For the deposition of the metal nanowire ink, any reasonable deposition approach can be used, such as dip coating, spray coating, knife edge coating, bar coating, Meyer-rod coating, slot-die, gravure printing, spin coating or the like. The ink can have properties, such as viscosity, adjusted appropriately with additives for the desired deposition approach. Similarly, the deposition approach directs the amount of liquid deposited, and the concentration of the ink can be adjusted to provide the desired loading of metal nanowires on the surface. After forming the coating with the dispersion, the sparse metal conductive layer can be dried to remove the liquid.

The films can be dried, for example, with a heat gun, an oven, a thermal lamp or the like, although the films that can be air dried can be desired in some embodiments. In some embodiments, the films can be heated to temperatures from about 50° C. to about 150° C. during drying. After drying, the films can be washed one or more times, for example, with an alcohol or other solvent or solvent blend, such as ethanol or isopropyl alcohol, to removed excess solids to lower haze. Patterning can be achieved in several convenient ways. For example, printing of the metal nanowires can directly result in patterning. Additionally or alternatively, lithographic techniques can be used to remove portions of the metal nanowires, prior to or after fusing, to form a pattern.

Transparent Film Electrical and Optical Properties

The fused metal nanostructured networks can provide low electrical resistance while providing good optical properties. Thus, the films can be useful as transparent conductive electrodes or the like. The transparent conductive electrodes can be suitable for a range of applications such as electrodes along light receiving surfaces of solar cells. For displays and in particular for touch screens, the films can be patterned to provide electrically conductive patterns formed by the film. The substrate with the patterned film, generally has good optical properties at the respective portions of the pattern.

Electrical resistance of thin films can be expressed as a sheet resistance, which is reported in units of ohms per square ($\Omega/\square$ or ohms/sq) to distinguish the values from bulk electrical resistance values according to parameters related to the measurement process. Sheet resistance of films is generally measured using a four point probe measurement or another suitable process. In some embodiments, the fused metal nanostructured networks can have a sheet resistance of no more than about 300 ohms/sq, in further embodiments no more than about 200 ohms/sq, in additional embodiments no more than about 100 ohms/sq and in other embodiments no more than about 60 ohms/sq. A person of ordinary skill in the art will recognize that additional ranges of sheet resistance within the explicit ranges above are contemplated and are within the present disclosure. Depending on the particular application, commercial specifications for sheet resistances for use in a device may not be necessarily directed to lower values of sheet resistance such as when additional cost may be involved, and current commercially relevant values may be for example, 270 ohms/sq, versus 150 ohms/sq, versus 100 ohms/sq, versus 50 ohms/sq, versus 40 ohms/sq, versus 30 ohms/sq, versus 20 ohms/sq or less as target values for different quality, touch response, and/or size touch screens, and each of these values defines a range between the specific values as end points of the range, such as 270 ohms/sq to 150 ohms/sq, 270 ohms/sq to 100 ohms/sq, 150 ohms/sq to 100 ohms/sq and the like with 15 particular ranges being defined. Thus, lower cost (i.e. lower materials cost per film area) films may be suitable for certain applications in exchange for modestly higher sheet resistance values. In general, sheet resistance can be reduced by increasing the loading of nanowires, but an increased loading may not be desirable from other perspectives, and metal loading is only one factor among many for achieving low values of sheet resistance.

For applications as transparent conductive films, it is desirable for the fused metal nanostructured networks to maintain good optical transparency. In principle, optical transparency is inversely related to the loading with higher loadings leading to a reduction in transparency, although processing of the network can also significantly affect the transparency. Also, polymer binders and other additives can be selected to maintain good optical transparency. The optical transparency can be evaluated relative to the transmitted light through the substrate. For example, the transparency of the conductive film described herein can be measured by using a UV-Visible spectrophotometer and measuring the total transmission through the conductive film and support substrate. Transmittance is the ratio of the transmitted light intensity (I) to the incident light intensity ($I_o$). The transmittance through the film ($T_{film}$) can be estimated by dividing the total transmittance (T) measured by the transmittance through the support substrate ($T_{sub}$). ($T=I/I_o$ and $T/T_{sub}=(I/I_o)/(I_{sub}/I_o)=I/I_{sub}=T_{film}$) Thus, the reported total transmissions can be corrected to remove the transmission through the substrate to obtain transmissions of the film alone. While it is generally desirable to have good optical transparency across the visible spectrum, for convenience, optical transmission can be reported at 550 nm wavelength of light. Alternatively or additionally, transmission can be reported as total transmittance from 400 nm to 700 nm wavelength of light, and such results are reported in the Examples below. In general, for the fused metal nanowire films, the measurements of 550 nm transmittance and total transmittance from 400 nm to 700 nm (or just "total transmittance" for convenience) are not qualitatively different. In some embodiments, the film formed by the fused network has a total transmittance (TT %) of at least 80%, in further embodiments at least about 85%, in additional embodiments, at least about 90%, in other embodiments at least about 94% and in some embodiments from about 95% to about 99%. Transparency of the films on a transparent polymer substrate can be evaluated using the standard ASTM D1003 ("Standard Test Method for Haze and Luminous Transmittance of Transparent Plastics"), incorporated herein by reference. A person or ordinary skill in the art will recognize that additional ranges of transmittance within the explicit ranges above are contemplated and are within the present disclosure. When adjusting the measured optical properties for the films in the Examples below for the substrate, the films have very good transmission and haze values, which are achieved along with the low sheet resistances observed.

The fused metal networks can also have low haze along with high transmission of visible light while having desirably low sheet resistance. Haze can be measured using a hazemeter based on ASTM D1003 referenced above, and the haze contribution of the substrate can be removed to provide haze values of the transparent conductive film. In some embodiments, the sintered network film can have a haze value of no more than about 1.2%, in further embodiments no more than about 1.1%, in additional embodiments no more than about 1.0% and in other embodiments from about 0.9% to about 0.2%. As described in the Examples, with appropriately selected silver nanowires very low values of haze and sheet resistance have been simultaneously achieved. The loading can be adjusted to balance the sheet resistance and the haze values with very low haze values possible with still good sheet resistance values. Specifically, haze values of no more than 0.8%, and in further embodiments from about 0.4% to about 0.7%, can be achieved with values of sheet resistance of at least about 45 ohms/sq. Also, haze values of 0.7% to about 1.2%, and in some embodiments from about 0.5% to about 0.9%, can be achieved with sheet resistance values of from about 30 ohms/sq to about 45 ohms/sq. All of these films maintained good optical transparency. A person of ordinary skill in the art will recognize that additional ranges of haze within the explicit ranges above are contemplated and are within the present disclosure.

With respect to the corresponding properties of the multilayered films, the additional components are generally selected to have a small effect on the optical properties, and various coatings and substrates are commercially available for use in transparent elements. Suitable optical coatings, substrates and associated materials are summarized above. Some of the structural material can be electrically insulating, and if thicker insulating layers are used, the film can be patterned to provide locations where gaps or voids through the insulating layers can provide access and electrical contact to the otherwise embedded electrically conductive element.

In some embodiments, for transparent conductive films, relevant properties of the film include, for example, the sheet resistance, transparency to visible light and for some embodiments haze. The desired sheet resistance may depend on a particular application. Generally, the sheet resistance can be no more than about 250 ohms/sq, in further embodiments no more than about 125 ohms/sq, in additional embodiments no more than about 100 ohms/sq. and in other embodiments no more than about 60 ohms/sq. Generally, the target sheet resistance can be accomplished while maintaining an optical transparency of the conductive layer over the visible range of at least about 90%, in further embodiments at least about 92.5% and in additional embodiments at least about 95%. Haze values can be achieved with transparent conductive layers meeting the ranges of sheet resistance and total transparency above with haze values of no more than about 1.5%, in some embodiments no more than about 1.25% and in additional embodiments no more than about 1.1%. A person of ordinary skill in the art will recognize that additional ranges of sheet resistance within the explicit ranges above are contemplated and are within the present disclosure.

Transparent Electrically Conductive Film Stability and Stability Testing

In use, it is desirable for the transparent conductive films to last a commercially acceptable time, such as the lifetime of the corresponding device. The sparse metal conductive layer can be evaluated in terms of maintenance of the conductive properties of the sparse metal conductive layers under appropriate testing. To test the performance, accelerated aging procedures can be used to provide objective evaluation over a reasonable period of time. These tests can be performed using commercially available environmental test equipment.

A selected test, which is used in the Examples involves black standard temperature of 60° C. (a setting of the apparatus), an air temperature of 38° C., a relative humidity of 50% and an irradiance of 60 W/m$^2$ (from 300 nm to 400 nm) from xenon lamps with a daylight filter. In another test, the sample is exposed to 85° C. and 85% relative humidity (85/85 test) without illumination. A third set of tests were performed by putting samples in a 150° C. oven without the further application of humidity or light. A variety of suitable test equipment is commercially available, such as Atlas Suntest™ XXL apparatus (Atlas Material Testing Solutions, Chicago, Ill., USA).

Under the test conditions specified in the previous paragraph, a sample can be evaluated by the change in sheet resistance as a function of time. The values can be normalized to the initial sheet resistance to focus on the time evolution. So generally the time evolution is plotted for $R/R_0$, where R is the time evolving sheet resistance measurement and $R_0$ is the initial value of sheet resistance. Appropriate time frames generally depend on the specific stability test. With respect to heating at a temperature of 150° C. at ambient humidity, the values of $R/R_0$ can be no more than a value of 3 at 1500 minutes, in further embodiment no more than a value of 2.5 and in additional embodiments no more than a value of 2 after 1500 minutes, and also no more than a value of 4 after 3000 minutes, in further embodiment no more than a value of 3.5 and in additional embodiment no more than a value of 3 after 3000 minutes. In light fade experiments described above, the value of $R/R_0$ can be a value of no more than about 1.3 after 300 hours, in further embodiment no more than about 1.2 after 300 hours and in additional embodiments no more than about 1.15 after 300 hours. In testing at 85° C. and 85% relative humidity, the value of $R/R_0$ can be no more than a value of 1.25 and no less than a value of 0.6 after 250 hours, in further embodiments no more than a value of 1.2 and in additional embodiment no more than a value of 1.15 and no less than a value of 0.7 after 250 hours of environmental testing. A person of ordinary skill in the art will recognize that additional ranges of $R/R_0$ and stability times within the explicit ranges above are contemplated and are within the present disclosure.

Touch Sensors

Figure 3:
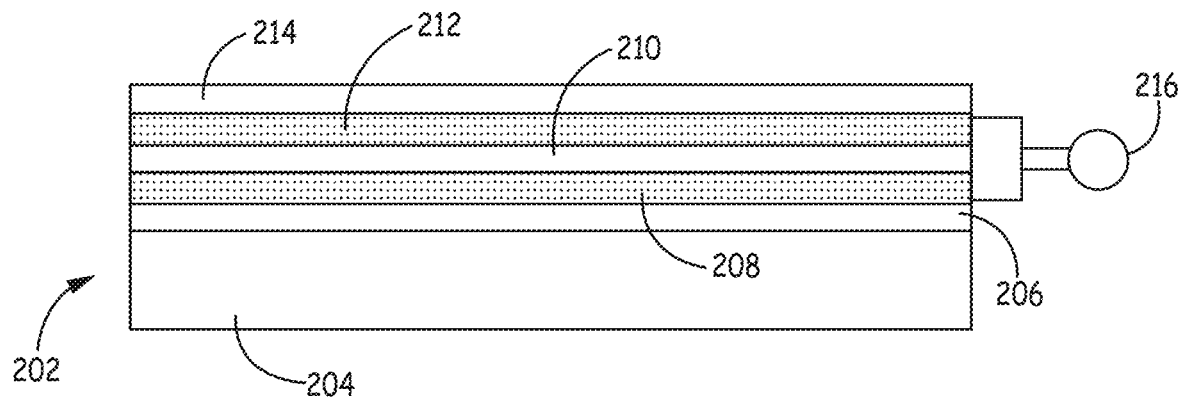
FIG. 3 is a schematic diagram showing a capacitance based touch sensor.
Figure 4:
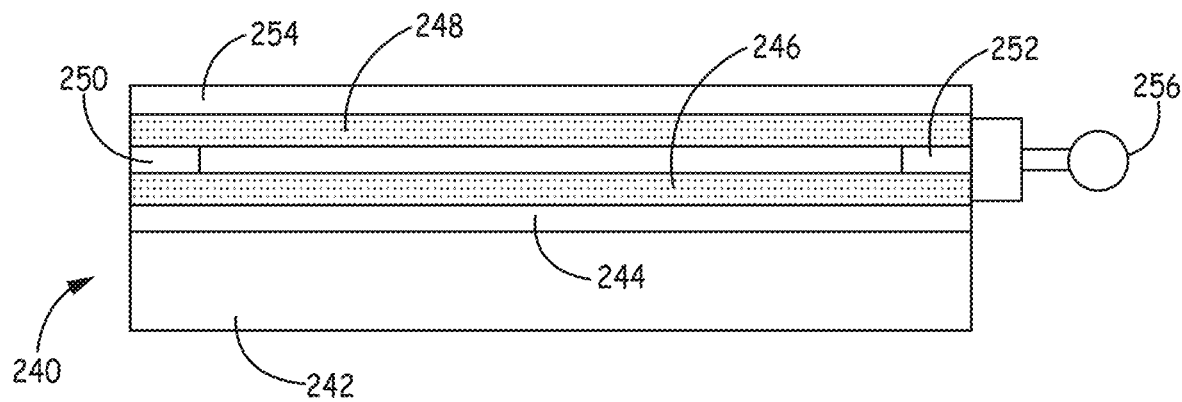
FIG. 4 is a schematic diagram showing a resistance based touch sensor.

The transparent conductive films described herein can be effectively incorporated into touch sensors that can be adapted for touch screens used for many electronic devices. Some representative embodiments are generally described here, but the transparent conductive films can be adapted for other desired designs. A common feature of the touch sensors generally is the presence of two transparent conductive electrode structures in a spaced apart configuration in a natural state, i.e., when not being touched or otherwise externally contacted. For sensors operating based on capacitance, a dielectric layer is generally between the two electrode structures. Referring to FIG. 3, a representative capacitance based touch sensor 202 comprises a display component 204, an optional bottom substrate 206, a first transparent conductive electrode structure 208, a dielectric layer 210, such as a polymer or glass sheet, a second transparent conductive electrode structure 212, optional top cover 214, and measurement circuit 216 that measures capacitance changes associated with touching of the sensor. Referring to FIG. 4, a representative resistance based touch sensor 240 comprises a display component 242, an optional lower substrate 244, a first transparent conductive electrode structure 246, a second transparent conductive electrode structure 248, support structures 250, 252 that support the spaced apart configuration of the electrode structures in their natural configuration, upper cover layer 254 and resistance measuring circuit 256. Alternatively the sensors can be composed of one single film with two layers of transparent conductors—one on each surface with the substrate (plastic or glass) which serves as both the support and as the dielectric layer. Sensor can also be composed of a single layer of transparent conductive material where more precise patterning and processing are required to spatially separate the "X" and "Y" conductive elements.

Display components 204, 242 can be, for example, LED based displays, LCD displays or other desired display components. Substrates 206, 244 and cover layers 214, 254 can be independently transparent polymer sheets or other transparent sheets. Support structures can be formed from a dielectric material, and the sensor structures can comprise additional supports to provide a desired stable device. Measurement circuits 216, 256 are known in the art.

Transparent conductive electrodes 208, 212, 246 and 248 can be effectively formed using fused metal networks, which can be patterned appropriately to form distinct sensors, although in some embodiments the fused metal networks form some transparent electrode structures while other transparent electrode structures in the device can comprise materials such as electrically conductive metal oxides, for example indium tin oxide, aluminum doped zinc oxide, indium doped cadmium oxide, fluorine doped tin oxide, antimony doped tin oxide, or the like as thin films or particulates, carbon nanotubes, graphene, conductive organic compositions or the like. Fused metal networks can be effectively patterned as described herein, and it can be desirable for patterned films in one or more of the electrode structures to form the sensors such that the plurality of electrodes in a transparent conductive structure can be used to provide position information related to the touching process. The use of patterned transparent conductive electrodes for the formation of patterned touch sensors is described, for example, in U.S. Pat. No. 8,031,180 to Miyamoto et al., entitled "Touch Sensor, Display With Touch Sensor, and Method for Generating Position Data," published U.S. patent application 2012/0073947 to Sakata et al., entitled "Narrow Frame Touch Input Sheet, Manufacturing Method of Same, and Conductive Sheet Used in Narrow Frame Touch Input Sheet," and U.S. Pat. No. 8,482,541 B2 to Hashimoto et al., entitled "Touch Panel and Portable Device Using the Same," all three of which are incorporated herein by reference.

Other Electronic Devices

The noble metal coated NW based transparent conductors can also be utilized for a variety of other applications aside from touch-sensors. In particular, the improved electrochemical stability, heat stability, and improved oxidative stability, make these materials well-suited as transparent conductors in applications such as electrochromics, PDLC (polymer-dispersed liquid crystals) devices and films. Compared to un-coated AgNWs, the broader range of chemical compatibility and overall durability of the noble metal coated NWs also indicate these (coated) materials may be better suited for the following applications: photovoltaics, smart-windows, electrochromics, OLED (lighting and displays), stable electrodes for electrochemical and biochemical sensors.

EXAMPLES

The following examples describe the synthesis of noble metal coated silver nanowires by both controlled galvanic replacement and direct deposition methods. Silver nanowires were used in the following examples with an average diameter of between 20 and 50 nm and an average length of 10-30 microns. The noble metal coated silver nanowires were collected after the coating reaction and stored as dispersions in appropriated solvents.

The controlled galvanic replacement experiments were aimed at depositing a thin layer of Pt or Au on the surface of Ag nanowires (AgNW) to avoid holes (incomplete coverage) and/or bimetallic nanoshell formation on the AgNWs. Control of the reduction potential was achieved by using ligands (L) to complex with Pt ions or Au ions. Selected ligands/complexes prevent conventional galvanic replacement at room temperature because the reduction potentials of Pt (Au)-complexes are presumably lower than that of the corresponding Ag/Ag$^+$-L (standard potential for Ag/Ag$^+$ is 0.80 V vs. SHE). The newly formed Pt (Au) complexes allowed for a mild galvanic replacement at elevated temperature to help deposit a smooth layer of Pt (Au) on top of Ag nanowires.

The direct deposition method was targeted at directly coating a thin layer of Pt on the surface of AgNWs by promoting reduction reactions while avoiding the galvanic replacement reaction between Pt-complex ions or Pt ions and AgNWs. Desirable reaction conditions were achieved by using complex ions to stabilize the Pt ions with additional help of surfactant molecules. Nitrite ions were used to complex with Pt ions to lower their reaction potentials and polyvinyl pyrrolidone (PVP) was applied to further stabilize the Pt complex ions and maintain a good dispersion of the nanowires. A relatively strong reducing agent, hydrazine, was used to rapidly reduce the Pt-nitrite complex ions to Pt$^0$ on the surface of silver. The presence in solution of the hydrazine effectively prevented the galvanic replacement reaction. To further avoid the galvanic replacement reaction, the aqueous growth solution comprising Pt-nitrite complexes and PVP was slowly added to the AgNW dispersion in order to maintain a low concentration of Pt-nitrite complexes in the reaction mixture.

Figure 5A:
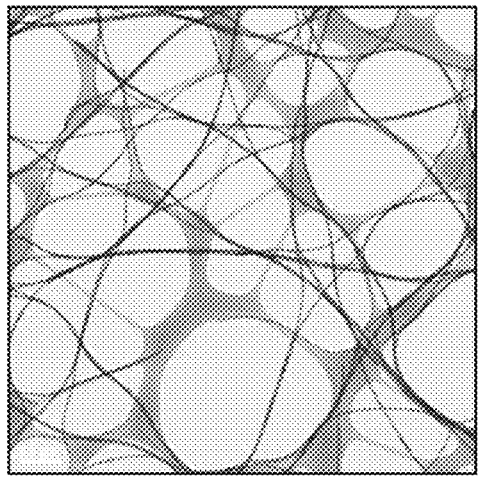
FIG. 5A is a low magnification transmission electron micrographs (TEM) of uncoated silver nanowires.
Figure 5B:
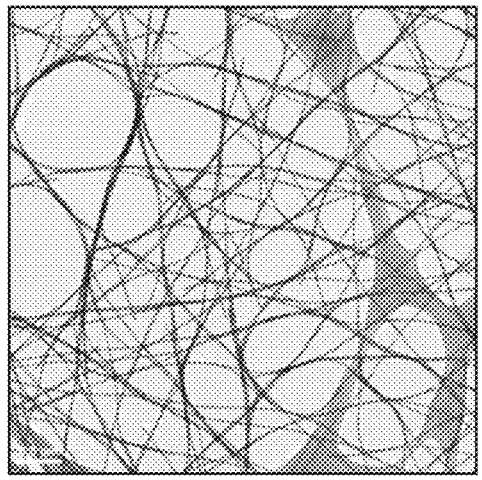
FIG. 5B is a low magnification TEM micrograph of platinum coated nanowires formed by galvanic exchange.
Figure 5C:
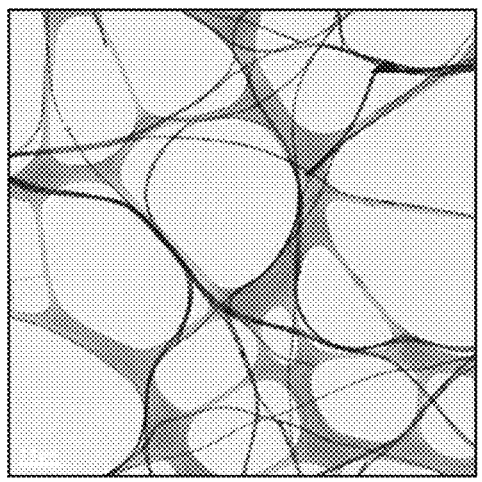
FIG. 5C is a low magnification TEM micrograph of platinum coated nanowires formed by direct deposition.
Figure 5D:
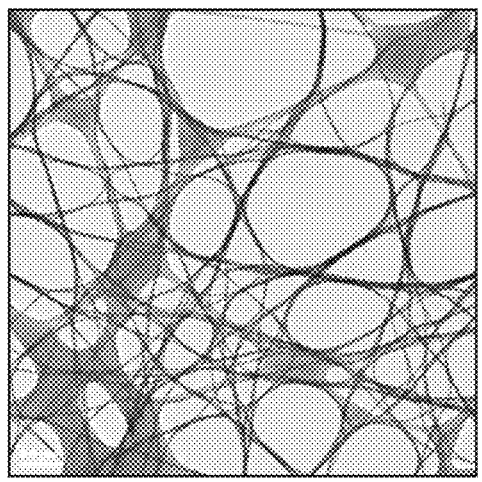
FIG. 5D is a low magnification TEM micrograph of gold coated silver nanowires formed by galvanic exchange.
Figure 6A:
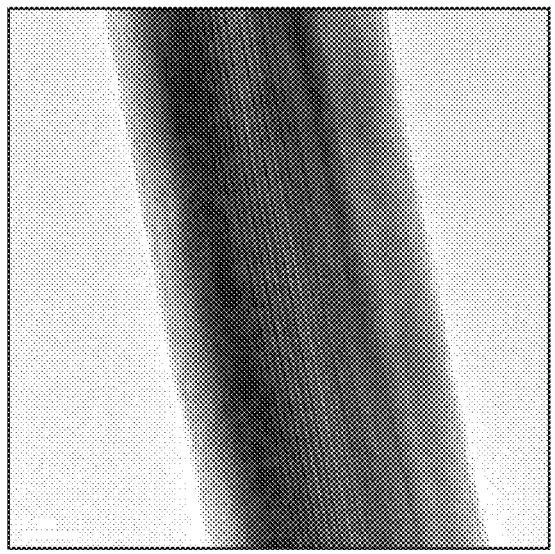
FIG. 6A is a TEM micrograph at higher magnification for the uncoated silver nanowires of FIG. 5A.
Figure 6B:
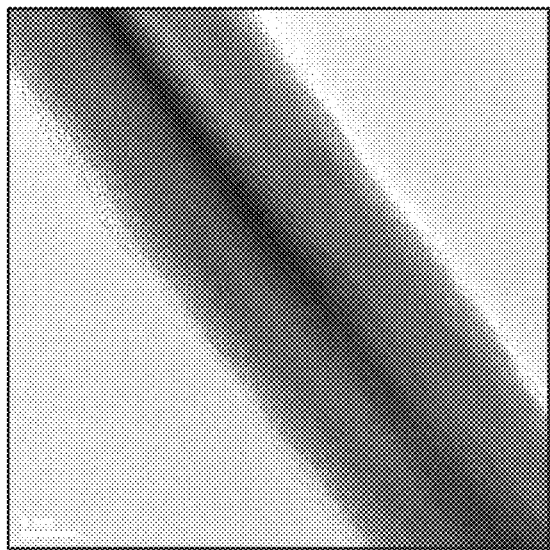
FIG. 6B is a TEM micrograph at higher magnification for the platinum coated nanowires formed by galvanic exchange of FIG. 5B.
Figure 6C:
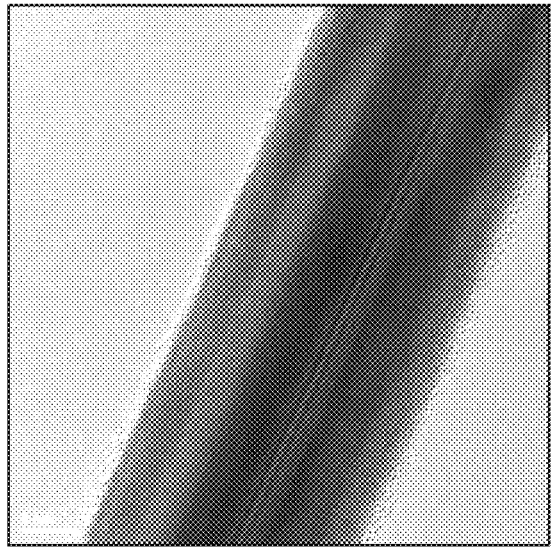
FIG. 6C is a TEM micrograph at higher magnification for the platinum coated nanowires formed by direct deposition of FIG. 5C.
Figure 6D:
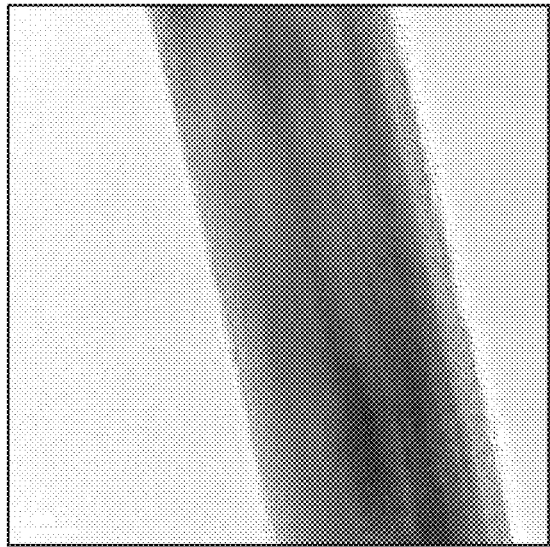
FIG. 6D is a TEM micrograph at higher magnification for the gold coated nanowires formed by galvanic exchange of FIG. 5D.

The noble metal coated silver nanowires were examined with transmission electron microscopy to evaluate the resulting nanowire and coating surface morphology. In FIG. 5 low magnification TEM images are given for uncoated silver nanowires (FIG. 5A) and for gold and platinum coated silver nanowires (FIGS. 5B-5D). It can be seen that the diameters and lengths of the wires were not significantly changed by the noble metal coating. Also at this scale no surface roughness could be detected. Further examination with higher magnification as shown in FIG. 6 (FIG. 6A uncoated silver nanowires) indicates that the coated nanowire surface remained relatively smooth (FIGS. 6B-6D).

Energy dispersive spectroscopy (EDS) analysis was used in conjunction with transmission electron microscopy to evaluate the composition of the nanowires after noble metal coating. FIGS. 7A-7E show elemental mapping for Ag and Pt for Pt coated AgNWs synthesized by controlled galvanic method. The EDS extract quantitative line scan indicates that a thin layer of Pt was uniformly deposited on the surface of Ag nanowires. Similarly, FIGS. 8 and 9 demonstrate that Pt was coated on the surface of silver nanowires by the direct deposition method, and that Au was coated on the surface of silver nanowires by the controlled galvanic method, respectively.

Figure 10A:
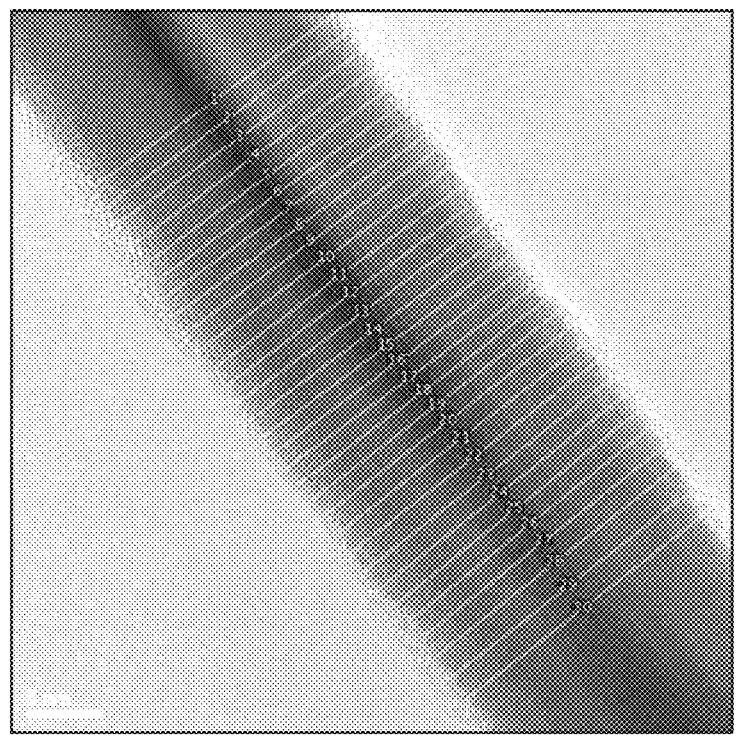
FIG. 10A is the high resolution TEM image of a Pt coated Ag nanowire in FIG. 6B with numbered lines showing the measure positions for the diameters.
Figure 10B:
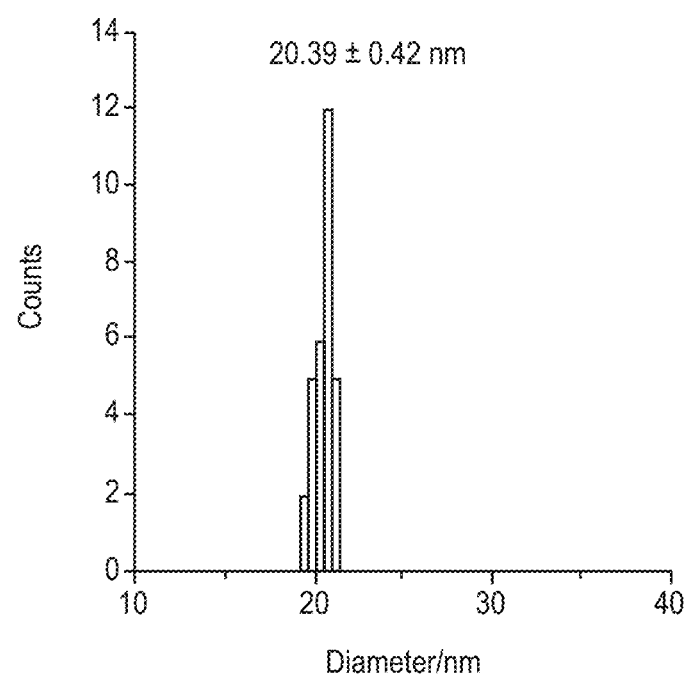
FIG. 10B is a statistical histogram of the measured diameters in FIG. 10A with 30 measurements in total.

High magnification transmission electron microscopy images offer the possibility to evaluate the smoothness of the nanowire surface after noble metal coating. In FIG. 10A the TEM image of a representative Pt coated silver nanowire was analyzed for diameter variations over a length of about 45 nm along the nanowire. Of 30 measured values the histogram shown in FIG. 10B suggested that the nanowire surface roughness was lower than 0.42 nm.

Figure 11:
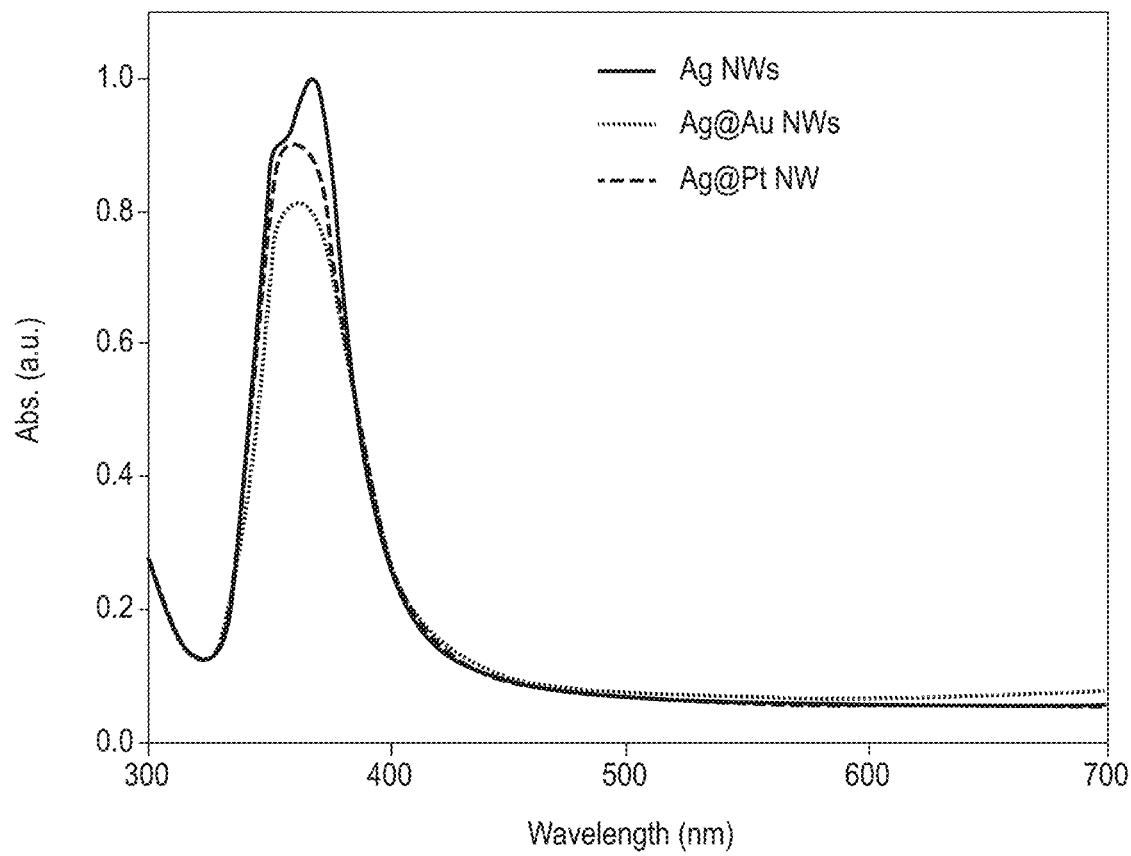
FIG. 11 is a plot of light absorption covering a portion of the UV, the visible spectrum and a portion of the infrared for representative uncoated silver nanowires (solid line), platinum coated silver nanowires (dashed line) and gold coated silver nanowires (dotted line).

Furthermore, the dimensions of the coated silver nanowires were compared with the uncoated nanowires by spectral measurement shown in FIG. 11, and the peak position and width (FWHM) were similar for the nanowires. The peak positions generally correlate with the average nanowire diameter. For the coated wires, the absorption spectrum becomes more symmetric, which suggest successful coating. The coating process can smooth over surface lattice defects in the bare wires so that the coated wires are more smooth, which is observed to result in a more symmetric absorption curve. The peak absorption intensity decreases somewhat with the coated nanowires with gold coated nanowires absorbing less than the platinum coated nanowires.

The synthesized noble metal coated silver nanowires were evaluated in transparent conductive films in comparison to uncoated silver nanowires. The testing described herein involved the formation of a fused metal nanostructured network on a PET polyester substrate. The fused metal nanostructured network was formed with a single ink comprising the uncoated or noble metal coated silver nanowires with a fusing composition. The inks were essentially as described, except for appropriate metal nanowire substitution, in Example 5 of copending U.S. Ser. No. 14/448,504, now U.S. Pat. No. 9,183,968 to Li et al., entitled "Metal Nanowire Inks for the Formation of Transparent Conductive Films with Fused Networks," incorporated herein by reference. The metal nanowire ink comprised noble metal coated silver nanowires at a level between 0.1 to 1.0 wt %, between 0.05 mg/mL and 2.5 mg/mL silver ions, and a cellulose based binder or a Chitosan based binder at concentrations from about 0.01 to 1 wt %. The nanowire inks were aqueous solutions with a small amount of alcohol. The ink was slot coated onto a PET polyester film. After coating the nanowire inks, the films were then heated in an oven at 100° C. for 10 min or at 130° C. for 5 min to dry the films, which also results in fusing of the nanowires into a network.

A polymer hard coating was applied over some samples of the fused metal nanostructured network. The polymer overcoat was either a commercial coating material from Dexterials or in-house prepared crosslinkable coatings, HG03 or HG06. The HG03 and HG06 coating materials included a blend of a commercial UV crosslinkable acrylate hard coating composition with a cyclic-siloxane epoxy resin and a polyurethane, as described in copending U.S. patent application Ser. No. 14/741,119 to Gu et al., entitled "Transparent Polymer Hardcoats and Corresponding Transparent Films", incorporated herein by reference. Generally, after application of the overcoat the transparent conductive films were subjected to UV light to form crosslinked polymers.

The total transmission (TT) and haze of the metal nanowire film samples were measured using a Haze Meter with films on a polymer substrate. To adjust the haze measurements for the samples below, a value of substrate haze can be subtracted from the measurements to get approximate haze measurements for the transparent conductive films alone. The instrument is designed to evaluate optical properties based on ASTM D 1003 standard ("Standard Test Method for Haze and Luminous Transmittance of Transparent Plastics"), incorporated herein by reference. The total transmission and haze of the bare commercial polymer film substrates are provided in the Examples below. CIELAB values of b* were determined using commercial software from measurements made with a Konica Minolta Spectrophotometer CM-3700A with SpectraMagic™ NX software.

To evaluate the stability or durability of the films containing uncoated or noble metal coated silver nanowires, the films were subjected to environmental and chemical testing. In environmental tests, the film samples were exposed to light irradiation and heat and humidity conditions. In the Light Fade Test, the film samples were exposed to light at elevated irradiance, temperature and relative humidity of 60 W/m² (300 nm-400 nm), 60° C. and 50% respectively in an Atlas SUNTEST™ XXL+ apparatus. Experiments were performed on either the coated films with or without the polymer overcoat, or on a stack with additional layers added over the overcoat layer. The results are shown as the change in film conductivity as the ratio of final sheet resistance to initial sheet resistance ($R/R_0$) after a specific light exposure time.

Three additional tests were performed in the testing apparatus. In one test, the temperature was set at 85° C. at a relative humidity of 85% without illumination. This test is referred to as the 85/85 test. A further test was performed at 85° C. with no controlled humidity or illumination. This test is referred to as the 85 C test. A third test was performed at 150° C. without added humidity or light, which is referred to as the 150 C test. For the 85/85 test, the 85 C test and the 150 C test, the change in film conductivity is presented as a ratio of final sheet resistance to initial sheet resistance ($R/R_0$) after the specified amount of time.

The transparent conductive film made of the coated AgNWs was also used as the electrode in an electrochemical cell and cyclic voltammetry (CV) measurements were carried out to evaluate the electrochemical stability. In the examples the transparent conductive film was used as the working electrode. An electrolyte inert in the applied voltage range was used. Stable transparent conductive films under test would not exhibit detectable current between the working and counter electrodes.

Example 1

Synthesis of Pt Coated Silver Nanowires by Controlled Galvanic Replacement

Figure 7A:
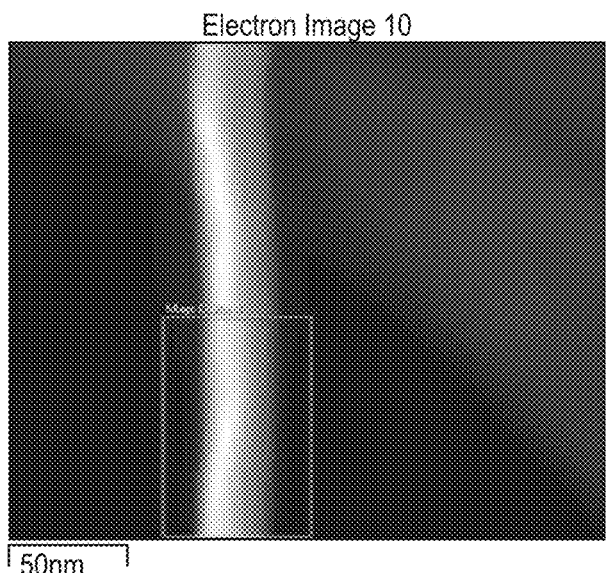
FIG. 7A is a TEM micrograph of a platinum coated silver nanowire formed using galvanic exchange with an area marked off for EDS elemental analysis.
Figure 7B:
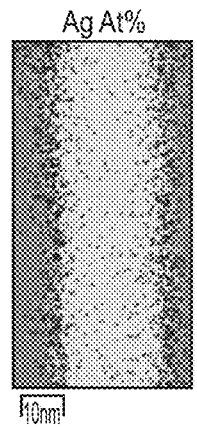
FIG. 7B is a visual map of silver concentration with visualization based on atomic percent silver across the mapped area of the wire shown in FIG. 7A.
Figure 7C:
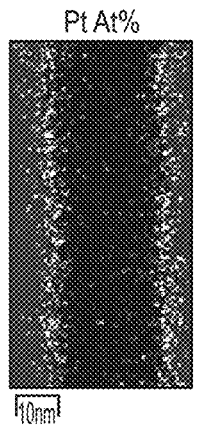
FIG. 7C is a visual map of platinum concentration with visualization based on atomic percent platinum across the mapped area of the wire shown in FIG. 7A.
Figure 7D:
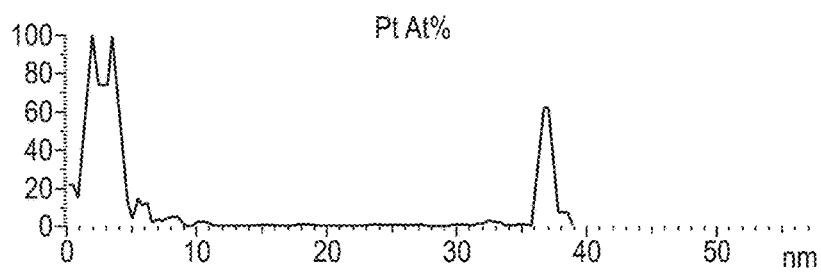
FIG. 7D is a plot of platinum concentration in atomic percent as a function of radial position along a cross section of the nanowire based on the analysis outlined in FIG. 7A.
Figure 7E:
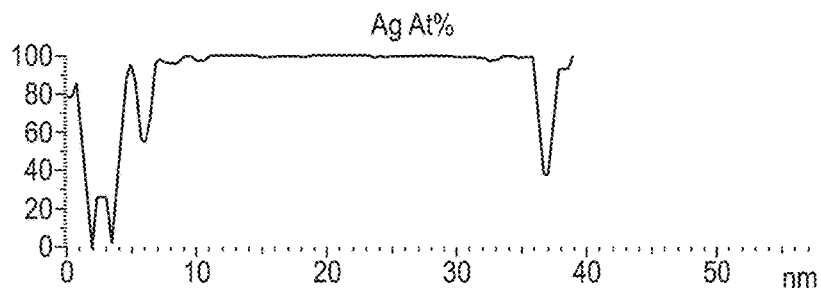
FIG. 7E is a plot of silver concentration in atomic percent as a function of radial position along a cross section of the nanowire based on the analysis outlined in FIG. 7A.

This Example demonstrates the effective coating of silver nanowires using galvanic replacement. A dispersion of Ag nanowires in isopropanol (1 wt %, 100 mL) was mixed with 300 mL DI water and heated to boiling (~85° C.). To the boiling mixture under magnetic stirring, a Pt growth solution, composed of 350 mL of deionized water, 0.75 mL of a chloroplatinic acid solution ($H_2PtCl_6$, 0.1 M) and 0.2 mL of ethylene diamine, was added dropwise at a rate between 200 and 800 µL/min. After the addition the mixture was cooled to room temperature, and the Pt coated Ag nanowires were purified 3 times by precipitation with the addition of acetone followed by centrifugation, rinsing with deionized water and following purification redispersion into 100 mL of isopropanol. TEM micrographs of representative coated nanowires are shown in the FIG. 5B (lower magnification) and 6B (higher magnification). EDS measurements of composition for a representative coated nanowire are shown in FIGS. 7A-7E. FIG. 7A shows the TEM image of the coated nanowire with the area marked for the EDS quantitative line scan. FIGS. 7B and 7C show the images of evaluation of silver atomic percent and platinum atomic percent, respectively. Correspondingly, FIGS. 7D and 7E are plots of atomic percent scanned across the nanowire cross section for platinum and silver, respectively.

Example 2

Synthesis of Pt Coated Silver Nanowires by Direct Deposition

Figure 8A:
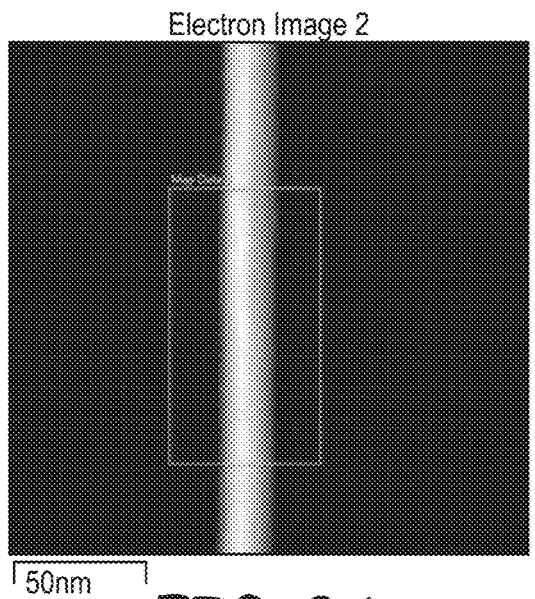
FIG. 8A is a TEM micrograph of a platinum coated silver nanowire formed using the direct coating process with an area marked off for EDS elemental analysis.
Figure 8B:
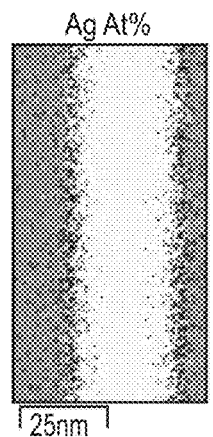
FIG. 8B is a visual map of silver concentration with visualization based on atomic percent silver across the mapped area of the wire shown in FIG. 8A.
Figure 8C:
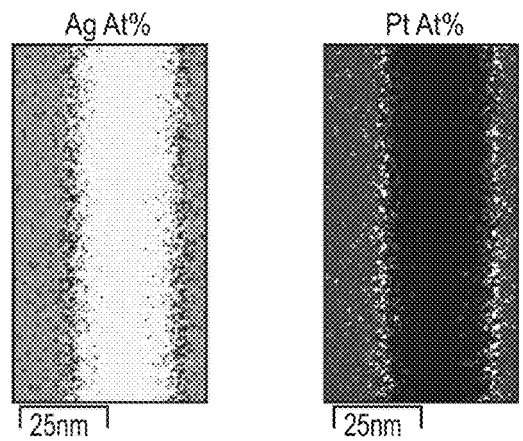
FIG. 8C is a visual map of platinum concentration with visualization based on atomic percent platinum across the mapped area of the wire shown in FIG. 8A.
Figure 8D:
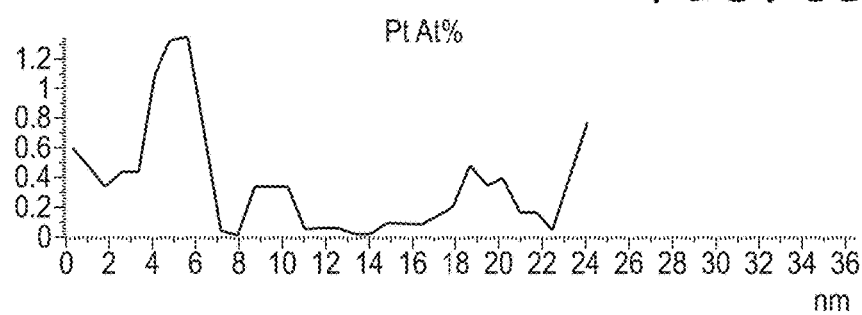
FIG. 8D is a plot of platinum concentration in atomic percent as a function of radial position along a cross section of the nanowire based on the analysis outlined in FIG. 8A.
Figure 8E:
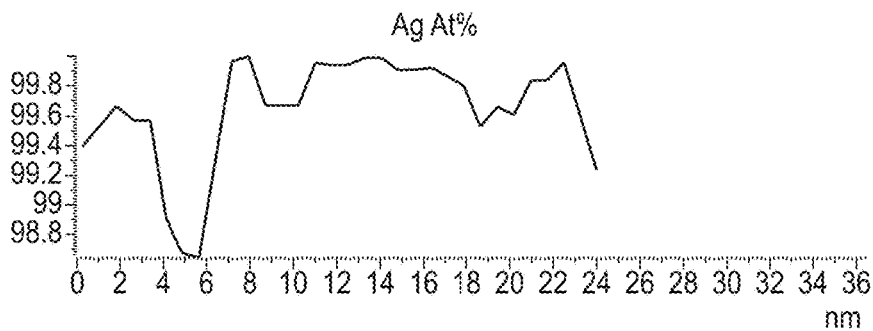
FIG. 8E is a plot of silver concentration in atomic percent as a function of radial position along a cross section of the nanowire based on the analysis outlined in FIG. 8A.

This Example demonstrates the effective coating of silver nanowires with platinum using direct deposition. A dispersion of silver nanowires in isopropanol (1 wt %, 360 g) was mixed with 1380 mL of deionized water, followed by the addition of 40 mL of an aqueous polyvinyl pyrrolidone (PVP) solution (5 wt %) and 0.9 mL of a hydrazine solution (35 wt %). A platinum (Pt) precursor mixture composed of 160 mL of deionized water, 16 mL of aqueous PVP solution (5 wt %), 9.6 mL of aqueous sodium nitrite solution ($NaNO_2$, 1 M) and 1.6 mL of a chloroplatinic acid solution ($H_2PtCl_6$, 0.1 M), was added dropwise at a rate between 200 and 800 µL/min. Magnetic stirring was maintained throughout the process. The final product was washed 3 times with deionized water in each case following acetone precipitation and centrifugation, and washed nanowires are redispersed in 360 g of isopropanol. TEM micrographs of representative coated nanowires are shown in the FIGS. 5C (lower magnification) and 6C (higher magnification). EDS measurements of composition for a representative coated nanowire are shown in FIGS. 8A-8E. FIG. 8A shows the TEM image of the coated nanowire with the area marked for the EDS quantitative line scan. FIGS. 8B and 8C show the images of evaluation of silver atomic percent and platinum atomic percent, respectively. Correspondingly, FIGS. 8D and 8E are plots of atomic percent scanned across the nanowire cross section for platinum and silver, respectively.

Example 3

Synthesis of Au Coated Silver Nanowires by Controlled Galvanic Replacement

Figure 9A:
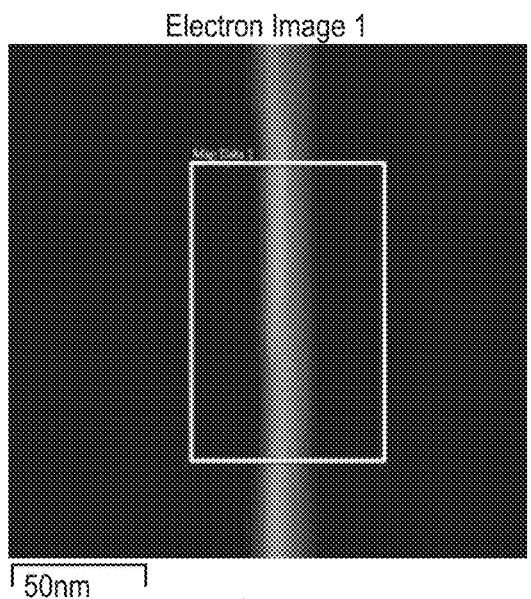
FIG. 9A is a TEM micrograph of a gold coated silver nanowire formed using galvanic exchange with an area marked off for EDS elemental analysis.
Figure 9B:
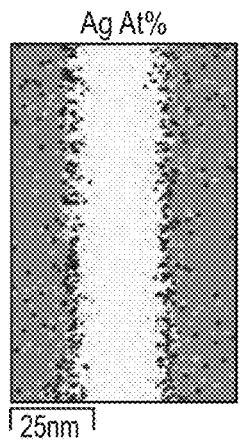
FIG. 9B is a visual map of silver concentration with visualization based on atomic percent silver across the mapped area of the wire shown in FIG. 9A.
Figure 9C:
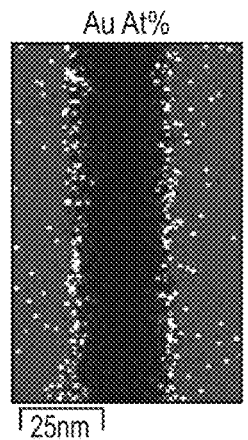
FIG. 9C is a visual map of gold concentration with visualization based on atomic percent gold across the mapped area of the wire shown in FIG. 9A.
Figure 9D:
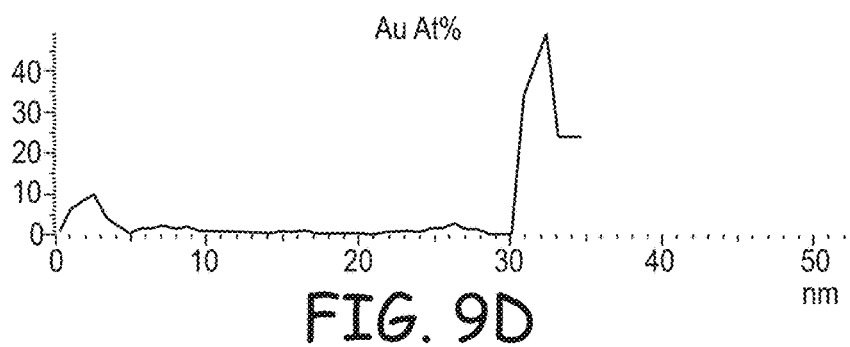
FIG. 9D is a plot of gold concentration in atomic percent as a function of radial position along a cross section of the nanowire based on the analysis outlined in FIG. 9A.
Figure 9E:
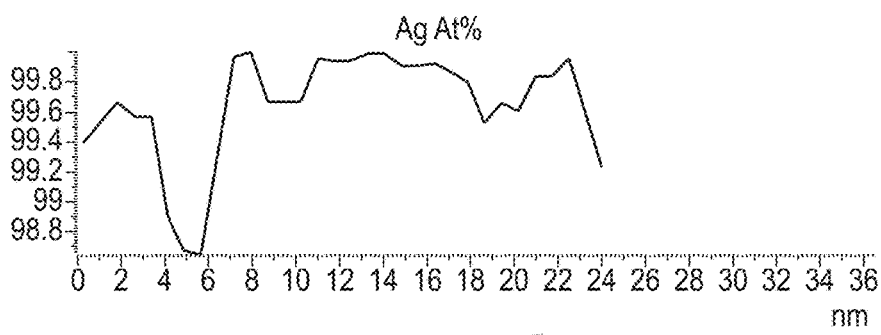
FIG. 9E is a plot of silver concentration in atomic percent as a function of radial position along a cross section of the nanowire based on the analysis outlined in FIG. 9A.

This Example demonstrates the effective coating of silver nanowires with gold using galvanic replacement. A dispersion of Ag nanowires in isopropanol (1 wt %, 100 mL) was mixed with 300 mL DI water and heated to boiling (~85° C.). To the boiling mixture under magnetic stirring, a Au growth solution, composed of 350 mL of deionized water, 0.3 mL of a chloroauric acid ($HAuCl_4$, 0.25 M), and 0.2 mL of ethylene diamine, was added dropwise at a rate between 200 and 800 μL/min. After the addition the mixture was cooled to room temperature and the Au coated Ag nanowires were purified 3 times by precipitation with acetone, centrifugation followed by washing with deionized water, and the washed nanowires were redispersed into 100 mL of isopropanol. TEM micrographs of representative coated nanowires are shown in the FIGS. 5D (lower magnification) and 6D (higher magnification). EDS measurements of composition for a representative coated nanowire are shown in FIGS. 9A-9E. FIG. 9A shows the TEM image of the coated nanowire with the area marked for the EDS quantitative line scan. FIGS. 9B and 9C show the images of evaluation of silver atomic percent and platinum atomic percent, respectively. Correspondingly, FIGS. 9D and 9E are plots of atomic percent scanned across the nanowire cross section for platinum and silver, respectively.

Example 4

Coating Pt at Different Thickness onto Silver Nanowires by the Direct Deposition Method This example provides an examination of coated nanowire properties as a function of platinum coating thickness.

The thickness of a platinum coating is adjusted using direct deposition. As noted above, the direct deposition method offers a greater ability of tuning the Pt coating thickness on the Ag nanowires, whereas galvanic replacement is typically self-limiting. The Pt thickness was controlled by the amount of the platinum (Pt) precursor solution used in the reaction. The procedures were similar to that described in Example 2, except that different amounts of Pt growth solution were used for a fixed amount of silver nanowires. The details for five coated silver nanowires with varied Pt thicknesses are given in Table 1 below.

TABLE 1

Preparation of Silver Nanowires of Different Pt Coating Thickness

| Sample | Pt thickness Designation | Water, mL | PVP (5 wt %), mL | $NaNO_2$ (1M), mL | $H_2PtCl_6$ (0.1M), mL |
|---|---|---|---|---|---|
| 1 | 40 μL | 80 | 8 | 4.8 | 0.8 |
| 2 | 60 μL | 120 | 12 | 7.2 | 1.2 |
| 3 | 80 μL | 160 | 16 | 9.6 | 1.6 |
| 4 | 120 μL | 240 | 24 | 14.4 | 2.0 |
| 5 | 160 μL | 320 | 32 | 19.2 | 3.2 |

Figure 12:
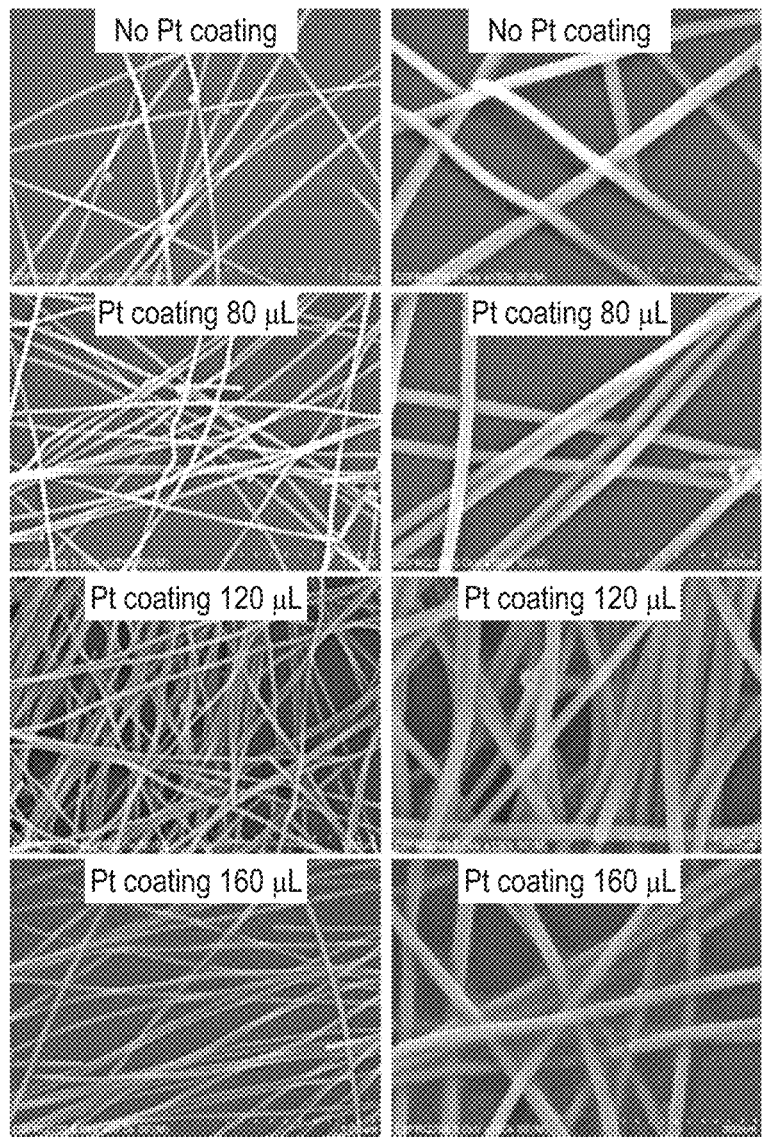
FIG. 12 is a set of scanning electron micrograph images for a set of silver nanowires with a range of platinum coatings formed by direct deposition with coating amounts as specified by the amount of coating composition added in microliters during the coating process, in which lower magnification images are in the left column and higher magnification images are in the right column for uncoated silver nanowires at the top and increased amounts of platinum coated in lower images in each column (80 µL second image in each column, 120 µL third image of each column, and 160 µL fourth image in each column).
Figure 13:
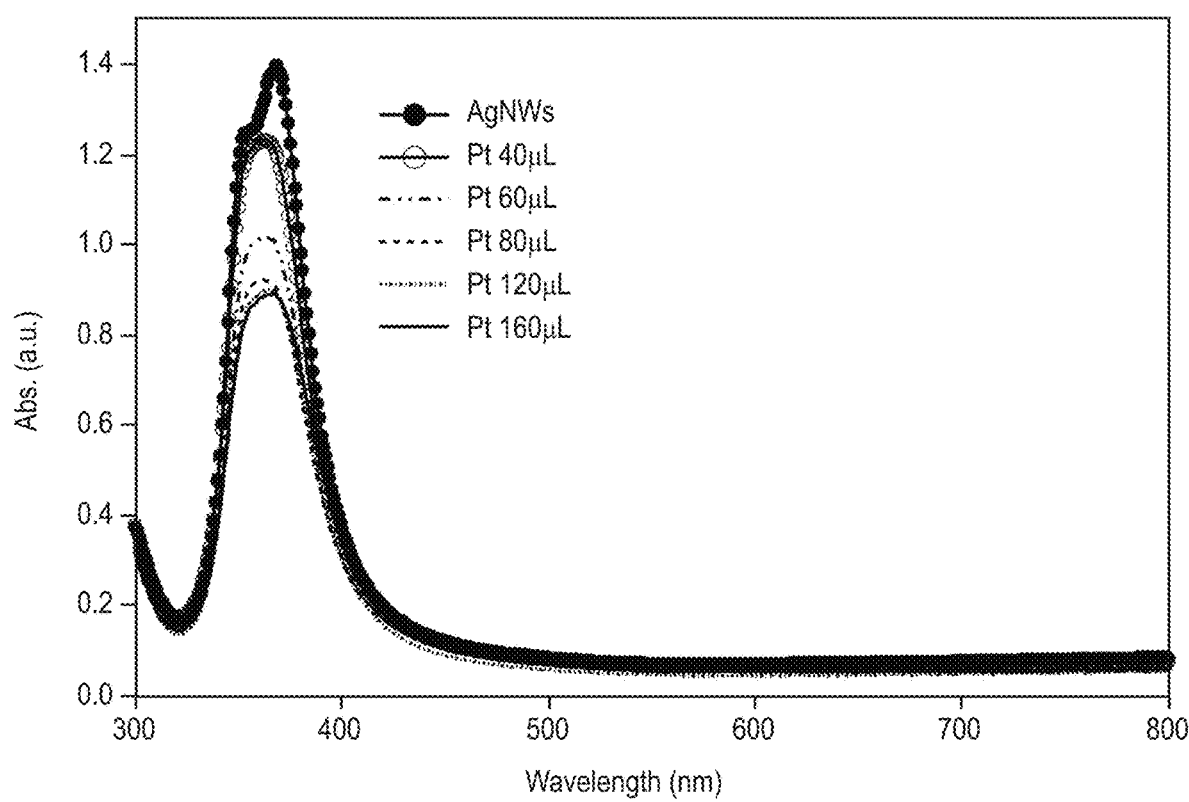
FIG. 13 is a plot of light absorption for uncoated silver nanowires and silver nanowires with 5 different platinum coating thicknesses (40 µL Pt coating solution, 60 µL Pt coating solution, 80 µL Pt coating solution, 120 µL Pt coating solution and 160 µL Pt coating solution).
Figure 14A:
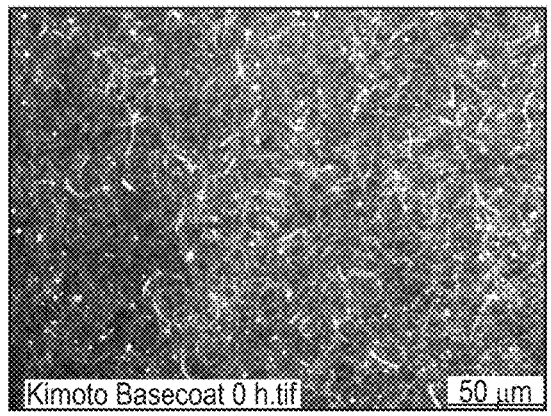
FIG. 14A is an optical microscopic photograph of uncoated silver nanowires.
Figure 14C:
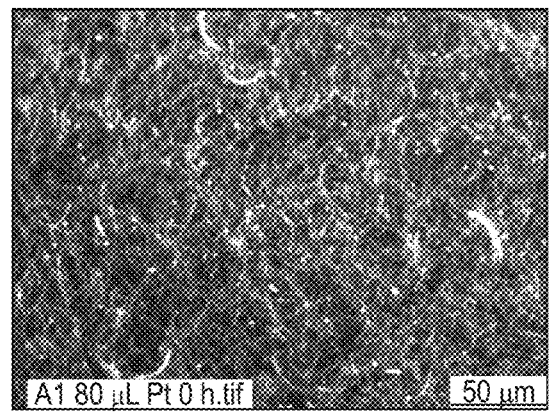
FIG. 14C is an optical microscopic photograph of Pt coated silver nanowires.
Figure 14B:
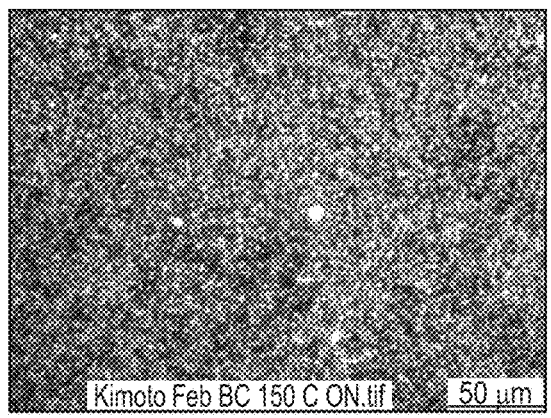
FIG. 14B is an optical microscopic photograph of the uncoated silver nanowires of FIG. 14A after exposure to 150° C. conditions for 50 hours.
Figure 14D:
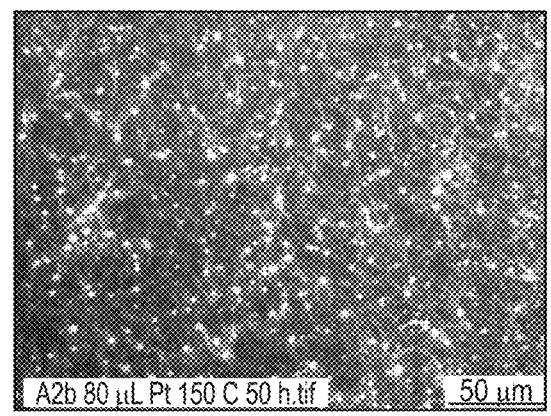
FIG. 14D is an optical microscopic photograph of the Pt coated silver nanowires of FIG. 14C after exposure to 150° C. conditions for 50 hours.

FIG. 12 shows the scanning electron microscopy (SEM) images of the nanowires with different thicknesses of Pt coatings. UV-vis-NIR spectra of dispersions of these nanowires, FIG. 13, show that the thicker Pt coatings led to lower peak absorption due to diminished surface plasmon resonance by the Pt coating. The nanowires with different coating thicknesses are examined in subsequent examples with respect to stability under different environmental conditions.

For three selected Pt thicknesses, ICP-MS (inductively coupled plasma-mass spectroscopy) analysis was performed to obtain a quantitative evaluation of the amount of platinum coating. The results of the ICP-MS analysis are presented in Table 2. It can be seen that the detected level of Pt correlates with the amount of Pt coating solution used.

TABLE 2

| Sample | Ag wt % | Pt wt % | Ag at % | Pt at % |
|---|---|---|---|---|
| Ag@PtNW_80 uL | 99.74 | 0.26 | 99.86 | 0.14 |
| Ag@PtNW_320 uL | 98.4 | 1.6 | 99.1 | 0.9 |
| Ag@PtNW_640 uL | 96.5 | 3.5 | 98 | 2 |

Example 5

Performance of Transparent Conductive Films Comprising Noble Metal Coated Silver Nanowires This example demonstrates the ability of noble metal coated silver nanowires to form a nanostructured network on a polyester substrate.

As stated above, inks of the noble metal coated silver nanowires were prepared with a cellulose based binder, a wetting agent, and appropriate metal ions in an aqueous-alcohol mixture. The noble metal coated silver nanowires were prepared by galvanic exchange as specified in Examples 1 and 3. The inks were slot coated on a hard coated PET substrate and the films were then heated in an oven at 100° C. for 10 min or at 130° C. for 5 min to dry the films. The optical and electrical properties of the films were measured and summarized in Table 3 below (all values including substrate) for inks without fusing agents (metal ions) and for inks with fusing agents. It can be seen that similar to the uncoated silver nanowires, the noble metal coated silver nanowires gave excellent conductive films with desirable optical properties. The use of metal ions (SS) as fusing agent in the inks improved conductivity significantly as expected if fusing of adjacent nanowires occurs to form a fused metal nanostructured network.

TABLE 3

Performance of Noble Metal Coated Silver Nanowires in Transparent Conductive Films

| Sample | Nanowires | Fusing Agent | Sheet Resistance, Ω/□ | TT % | H % | b* |
|---|---|---|---|---|---|---|
| 1 | AgNW | none | 63.3 | 90.8 | 1.07 | 1.55 |
| 2 | AgNW | SS | 49.3 | 91.7 | 0.87 | 1.32 |
| 3 | Ag@AuNW | none | 74.7 | 91.6 | 1.07 | 1.5 |
| 4 | Ag@AuNW | SS | 62.0 | 91.3 | 1.12 | 1.4 |
| 5 | Ag@PtNW | none | 69.3 | 91.8 | 0.78 | 1.53 |
| 6 | Ag@PtNW | SS | 57.3 | 91.8 | 0.84 | 1.29 |

A second set of samples were prepared to compare the optical properties of films made with uncoated silver nanowires and with Pt coated silver nanowires at different thicknesses.

Four inks were prepared, one with uncoated and three with platinum coated silver nanowires at different thicknesses, each at the same nanowire loading in the ink and the same amount of metal ions (SS) as fusing agent. The optical properties of the resulting platinum coated silver nanowire films were compared with those of the uncoated silver nanowire film in Table 4. As can be seen, at the same loading in ink the platinum coated silver nanowires gave the resulting coatings comparable optical transparency, lower haze, and lower b* (more neutral color) than the uncoated silver nanowires.

TABLE 4

Optical Performance of Noble Metal Coated Silver Nanowires in Transparent Conductive Films

| AgNW (0.13 wt % in Stock Ink) | Sintering Solution | relative % H | relative b* | relative % TT |
|---|---|---|---|---|
| AgNW | SS | 1.00 | 1.00 | 1.00 |
| Ag@PtNW (80 μL) | SS | 0.70 | 0.81 | 1.01 |
| Ag@PtNW (120 μL) | SS | 0.77 | 0.82 | 1.00 |
| Ag@PtNW (160 μL) | SS | 0.68 | 0.78 | 1.00 |

Example 6

Thermal Stability of Films Made with Pt Coated Silver Nanowires of Various Pt Thicknesses This example demonstrates the improved thermal stability of noble metal coated silver nanowires in transparent conductive films.

Transparent conductive films were formed as described above with silver nanowires that were coated with Pt at different thicknesses from Example 4 or with uncoated silver nanowires for comparison. The films were placed in an oven at 150° C. to test the thermal stability of the different nanowires. FIG. 14 shows the optical images of the coatings before (FIG. 14A uncoated AgNW and FIG. 14B Pt coated AgNW) and after 50 hours of heating at 150° C. (FIG. 14C uncoated AgNW and FIG. 14D Pt coated AgNW). The uncoated silver nanowires completely broke up to nanoparticles after 50 hours of heating while the Pt coated AgNW remained largely intact after the thermal treatment.

Figure 15:
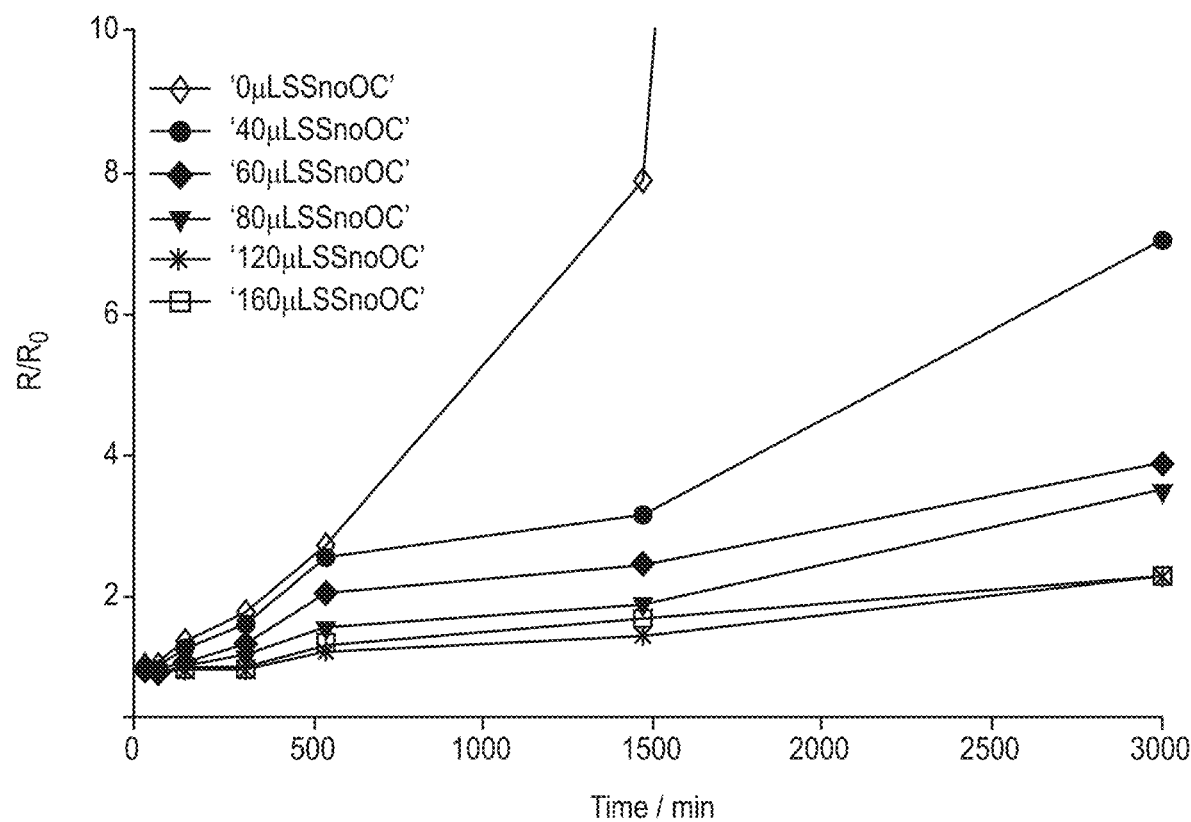
FIG. 15 is a plot of change in the ratio of sheet resistance to initial sheet resistance as a function of time for transparent conductive films under 150° C. test conditions for uncoated silver nanowires and for Pt coated silver nanowires with 5 different quantities of Pt coating material.

The effect of the thermal treatment on electrical conductivity was followed by measuring the sheet resistances of the films at specific time intervals. The ratio of sheet resistance (R) after a treatment time to that ($R_0$) before heating, $R/R_0$, is plotted against treatment time at 150° C. in FIG. 15. The plot shows that Pt coated silver nanowires exhibited greatly improved thermal stability over the uncoated silver nanowires in film. Thicker Pt coatings also showed better thermal stability in this test with the results suggesting a stability plateau after a certain amount of platinum is plated.

Example 7

Light Stability of Films Containing Pt Coated Silver Nanowires of Various Pt Thicknesses This example tests the light stability of films made with Pt coated silver nanowires of various Pt thicknesses.

Figure 16:
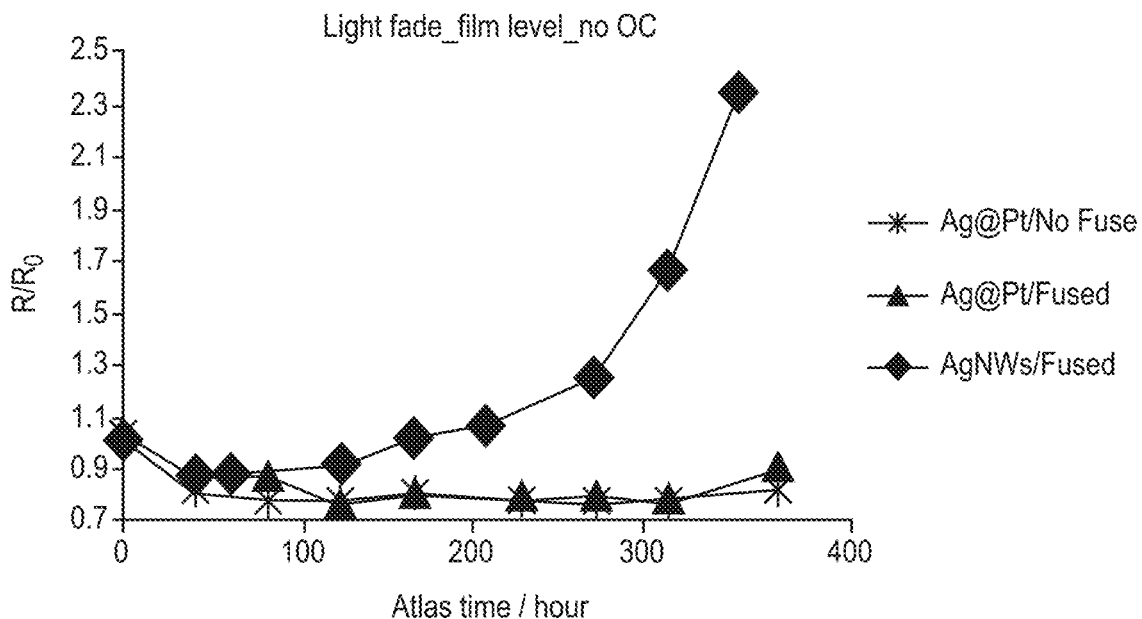
FIG. 16 is a plot of the ratio of sheet resistance to initial sheet resistance for three transparent conductive films without a polymer overcoat subjected to accelerated light fade conditions, in which film samples were a film formed with a fused metal nanostructured network formed with silver nanowires without a platinum coating, an unfused layer of platinum coated silver nanowires and a fused metal nanostructured network formed with platinum coated silver nanowires.

Transparent conductive films prepared with inks containing uncoated and Pt coated silver nanowires by the direct deposition method on hard coated PET substrate, as described above. Three films were prepared, one with uncoated silver nanowires for which the ink contained silver salt as fusing agent (SS), and two additional films with Pt coated silver nanowires one of which inks contained metal salt as fusing agent (SS). The films were placed in an Atlas SUNTEST XXL+ chamber for light fade test as described above. The ratio of sheet resistance (R) after a treatment time to that ($R_0$) before light irradiation, $R/R_0$, is plotted against treatment time as shown in FIG. 16. The Pt coated silver nanowires, fused or unfused films, showed improved light stability over the uncoated silver nanowires when fusing agents were present in the inks.

Example 8

High Humidity High Temperature Stability of Transparent Conductive Films Comprising Pt Coated Silver Nanowires of Various Pt Thicknesses This example demonstrates the improved stability of noble metal coated silver nanowires in transparent conductive films under high humidity and high temperature conditions.

Figure 17:
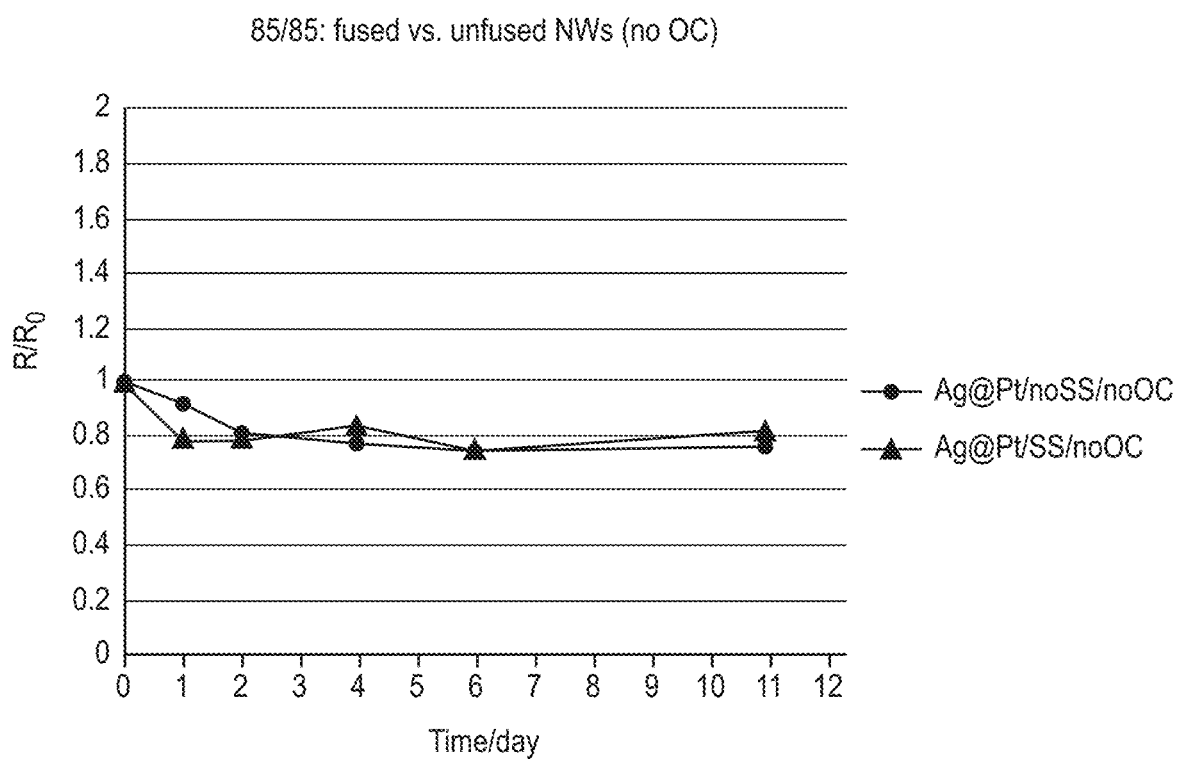
FIG. 17 is a plot of the ratio of sheet resistance to initial sheet resistance for two transparent conductive films without a polymer overcoat subjected to 85° C. and 85% humidity, in which the samples are a film of unfused platinum coated silver nanowire and a fused metal nanostructured network formed from platinum coated silver nanowires.

Transparent conductive films prepared with inks containing Pt coated silver nanowires by the direct deposition method on hard coated PET substrate, as described above. Two films were compared with one made with one ink containing no metal salt fusing agent and the other containing metal salt. The film samples were placed in an oven with conditions set at 85° C. and 85% relative humidity. The ratio of sheet resistance (R) after a treatment time to that ($R_0$) before, $R/R_0$, is plotted against treatment time as shown in FIG. 17. The plot shows that Pt coated silver nanowires showed good stability under the test conditions, and the ink without a fusing agent also gave good stability.

Figure 18:
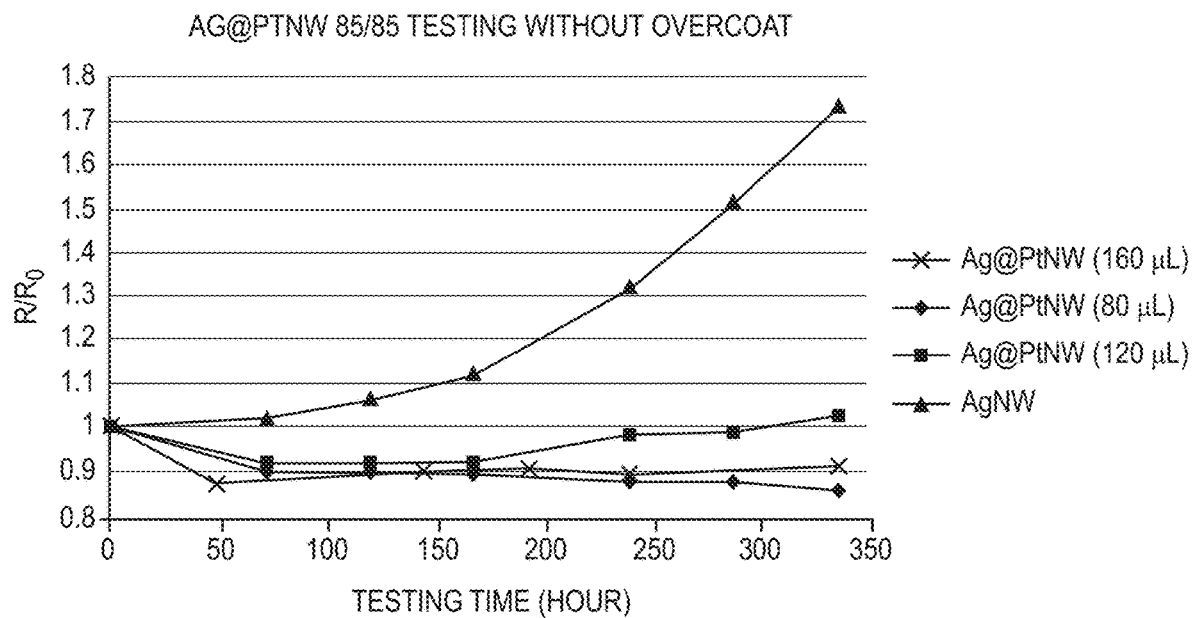
FIG. 18 is a plot of the ratio of sheet resistance to the initial sheet resistance as a function of time for four transparent conductive film samples under accelerated testing conditions with samples subjected to 85° C. and 85% humidity for samples of fused metal nanostructured networks formed with uncoated silver nanowires, or platinum coated silver nanowires with three different amounts of platinum coating as specified by the amount of platinum coating solution used (80 µL, 120 µL and 160 µL).

Another set of samples were prepared with different Pt coated silver nanowires of different Pt thicknesses (0, 80, 120, 160 μL). The test results in the 85° C./85% RH oven are shown in FIG. 18. Films made of Pt coated silver nanowires all showed greatly improved stability over that made of uncoated silver nanowires.

Example 9

Long Term Thermal Stability

This example tests the stability of noble metal coated silver nanowires in film under 85° C. conditions.

Figure 19:
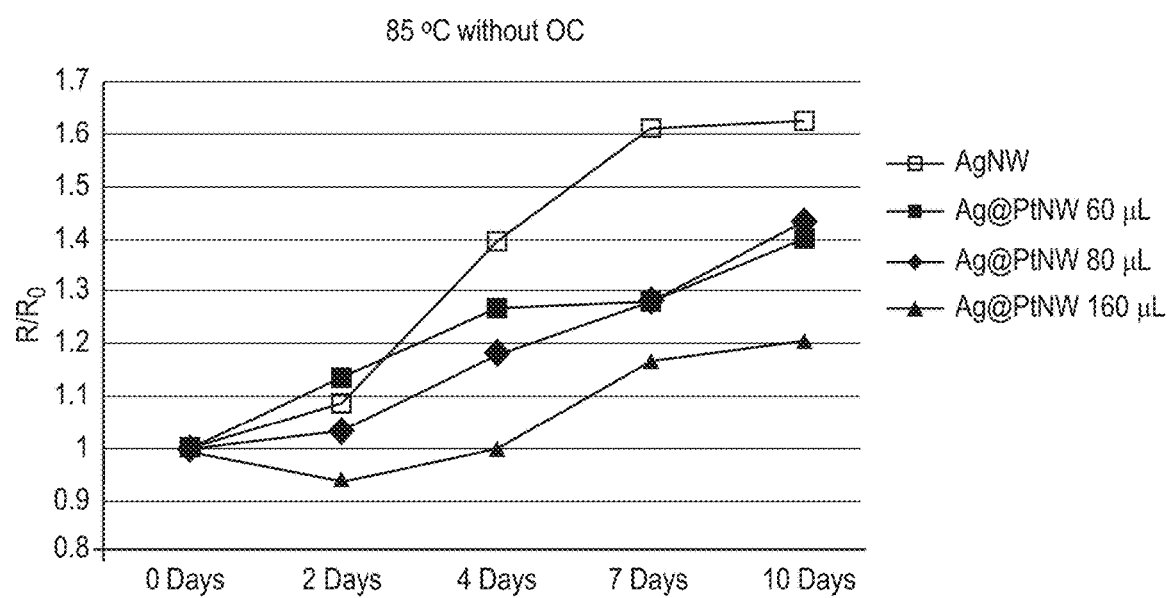
FIG. 19 is a plot of the ratio of sheet resistance to the initial sheet resistance as a function of time for four transparent conductive film samples under accelerated testing conditions with samples subjected to 85° C. without added humidity for samples of fused metal nanostructured networks formed with uncoated silver nanowires, or platinum coated silver nanowires with three different amounts of platinum coating as specified by the amount of platinum coating solution used (80 µL, 120 µL and 160 µL).

Inks were prepared with uncoated silver nanowires and Pt coated nanowires. Four films were prepared as described above, one with uncoated silver nanowires, and the other three with platinum coated silver nanowires at various Pt thicknesses, all containing metal salt as fusing agent. The film samples were tested for stability in an 85° C. oven without added humidity. The ratio of sheet resistance (R) after a treatment time to that ($R_0$) before heating, $R/R_0$, is plotted against treatment time in the 85° C. oven, and shown in FIG. 19. The Pt coated silver nanowires showed better stability, and thicker Pt coating led to more stable films in the test.

Example 10

Electrochemical Stability of Transparent Conductive Films Prepared with Pt Coated Silver Nanowires This example tests the electrochemical (or redox) stability of the noble metal coated silver nanowires in transparent conductive films.

The electrochemical stability of transparent conductive films were measured by cyclic voltammetry using films made of Pt coated Ag nanowires (Ag@PtNWs) as the working electrode. The nanowire film samples used in this example all had a polymer overcoat on top of the conductive layer. The tests were carried out with an electrochemical station, CHI411 from CH Instruments, Inc. (Austin, Tex.). Cells were built using nanowire films as the working electrode, a Pt wire as the counter electrode and a standard Ag/AgCl electrode as the reference. The electrolyte was an ethanol solution of tetrabutylammonium hexafluorophosphate (0.02M). No redox material was added. The applied voltage range was between −1.1 V to +1.1 V, and the sweep rate was 100 mV/s in all measurements. All experiments were carried out under ambient conditions.

Figure 20:
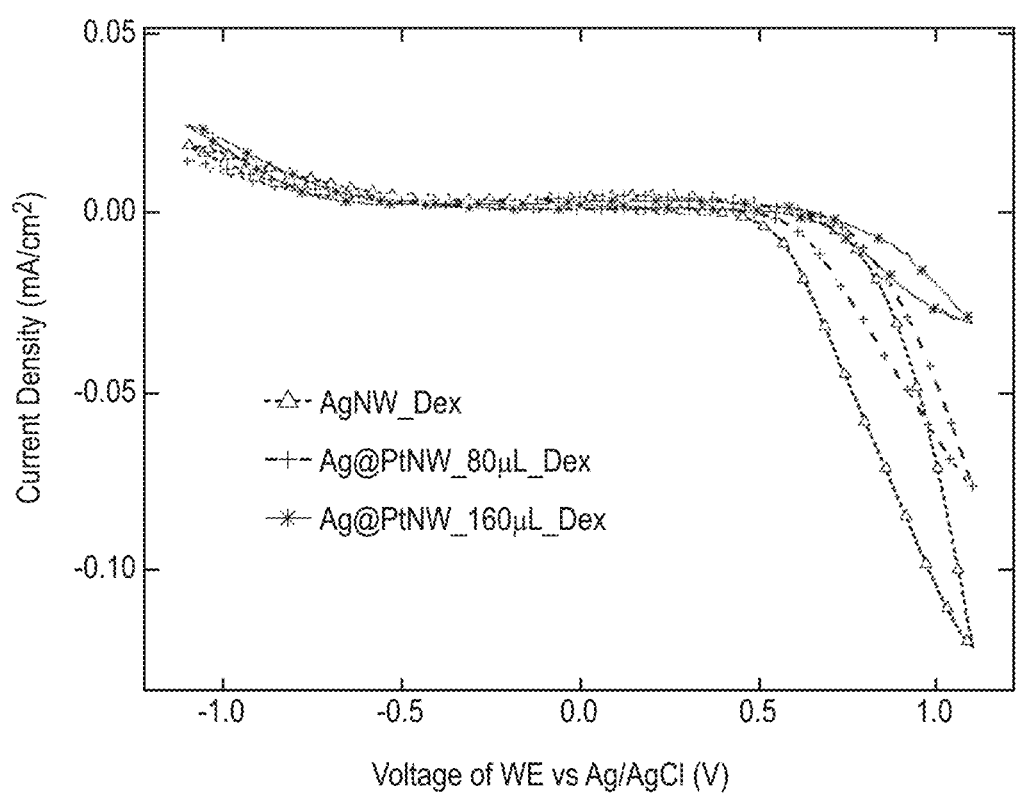
FIG. 20 is a plot of a set of cyclic voltammetry results showing current density as a function of voltage for four samples cycled from 1.1V to −1.1V for samples of fused metal nanostructured networks covered with a polymer hardcoating formed with uncoated silver nanowires, or platinum coated silver nanowires with two different amounts of platinum coating as specified by the amount of platinum coating solution used (80 µL and 160 µL).

For each cell a cyclic voltammetry cycle was performed and CV traces recorded. Representative cyclic voltammograms are shown in FIG. 20 (voltage range −1.1 V to +1.1 V) for cells made with films of coated silver nanowires at different noble metal thicknesses (Pt 80 µL and 160 µL coatings). Current flow indicates chemical reaction of the nanowires, so a decrease in current generation corresponds with greater stability of the nanowires. Working electrodes made based on AgNW transparent conductive films were considerably more unstable as compared to those composed of coated Ag@PtNW transparent conductive films. Moreover, the thicker Pt coatings showed better electrochemical stability. Stability with respect to applied voltages can be beneficial for use of the transparent conductive electrodes for certain applications in which higher voltages may be applied to the electrodes during operation of the device.

The embodiments above are intended to be illustrative and not limiting. Additional embodiments are within the claims. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein.

What is claimed is:

1. A method for forming noble metal coated silver nanowires by direct metal deposition, the method comprising:
    gradually adding a coating solution comprising dissolved non-silver noble metal ions and a metal ion complexing ligand into a reaction solution comprising dispersed silver nanowires and a reducing agent to form the noble metal coating on the silver nanowires, wherein the gradual addition is performed over a period from about 5 minutes to about 5 hours and
    harvesting noble metal coated silver nanowires having a root mean square roughness of no more than about 1 nm.

2. The method of claim 1 wherein the metal ion complexing ligand is selected from the group consisting of nitrite, diethyl amine, ethylene diamine, nitrilotriacetic acid, iminobis(methylene phosphonic acid), aminotris(methylene phosphonic acid), ethylene diamine tetraacetic acid (EDTA), 1,3-propylenediaminetetraacetic acid (1,3-PDTA), triethylene tetramine, tri(2-aminoethyl) amine, diethylenetriaminepentaacetic acid, 1,2-cyclohexanediaminotetraacetic acid, iminodiacetic acid, methyliminodiacetic acid, N-(2-acetamide) iminoacetic acid, N-(2-carboxyethyl) iminodiacetic acid, N-(2-carboxymethyl)imino dipropionic acid, picolinic acid, dipicolinic acid, histidine, combinations thereof.

3. The method of claim 1 wherein the coating solution has a molar ratio of at least about 2 ligands per noble metal ion.

4. The method of claim 1 wherein the reaction solution further comprises a capping polymer, wherein the coating solution comprises noble metal ions at from about 0.0001 M to about 5 M and wherein the reaction solution comprises from about 0.02 wt % to about 3.5 wt % silver nanowires, from about 0.01 wt % to about 1.5 wt % capping polymer and from about 1 micromolar to about 1 millimolar reducing agent.

5. The method of claim 1 further comprising harvesting noble metal coated silver nanowires having from about 0.05 wt % to about 15 wt % noble metal.

6. The method of claim 1 wherein the reducing agent comprises hydrazine.

7. The method of claim 1 wherein the reducing agent comprises $NaBH_4$, $LiAlH_4$, ascorbic acid, oxalic acid, or formic acid.

8. The method of claim 1 wherein the coating solution comprises gold ions or platinum ions.

9. The method of claim 1 wherein the coating solution comprises comprise noble ions in amounts generally ranging from about 0.1 at % to about 30 at % as a fraction of the total coated nanowire.

10. The method of claim 1 wherein the coating solution comprises from about 0.0001 M to about 0.025 M noble metal ions, a molar ratio of ligands to metal ions at least about 0.8, and from about 0.001 wt % to about 5 wt % polyvinylpyrrolidone.

11. The method of claim 1 wherein the reaction solution comprises from about 0.03 wt % to about 2.5 wt % silver nanowires, from about 0.02 wt % to about 1 wt % polyvinylpyrrolidone and from about 1 micromolar to about 1 millimolar reducing agent.

12. The method of claim 1 wherein as a result of the addition of the coating solution a coating reaction is allowed to proceed without adding heat.

13. The method of claim 1 wherein the gradual addition of the coating solution is performed at an approximate constant rate.

14. The method of claim 1 wherein the coated nanowires are harvested and washed.

15. The method of claim 1 further comprising harvesting noble metal coated silver nanowires having a standard deviation in diameter of no more than about 6% relative to the average diameter.

16. The method of claim 1 further comprising harvesting noble metal coated silver nanowires having from about 0.9 wt % to about 40 wt % noble metal.

* * * * *